(12) United States Patent  
Lee

(10) Patent No.: US 8,971,113 B2  
(45) Date of Patent: Mar. 3, 2015

(54) PSEUDO-8T NVSRAM CELL WITH A CHARGE-FOLLOWER

(71) Applicant: Aplus Flash Technology, Inc, San Jose, CA (US)

(72) Inventor: Peter Wung Lee, Saratoga, CA (US)

(73) Assignee: Aplus Flash Technology, Inc., Fremont, CA (US)

( * ) Notice: Subject to any disclaimer, the term of this patent is extended or adjusted under 35 U.S.C. 154(b) by 0 days.

(21) Appl. No.: 14/064,220

(22) Filed: Oct. 28, 2013

(65) Prior Publication Data

US 2014/0119119 A1     May 1, 2014

Related U.S. Application Data

(60) Provisional application No. 61/720,385, filed on Oct. 30, 2012.

(51) Int. Cl.  
    *G11C 11/34*        (2006.01)  
    *G11C 14/00*        (2006.01)

(52) U.S. Cl.  
    CPC .................................. *G11C 14/0063* (2013.01)  
    USPC ................. 365/185.08; 365/185.24

(58) Field of Classification Search  
    CPC ............................ G11C 16/10; G11C 16/0483  
    USPC ........................................ 365/185.08, 185.24  
    See application file for complete search history.

(56) References Cited

U.S. PATENT DOCUMENTS

| | | | |
|---|---|---|---|
| 4,703,456 A | 10/1987 | Arakawa | |
| 5,065,362 A | 11/1991 | Herdt et al. | |
| 5,563,839 A | 10/1996 | Herdt et al. | |
| 5,602,776 A | 2/1997 | Herdt et al. | |
| 5,828,599 A | 10/1998 | Herdt | |
| 5,903,561 A | 5/1999 | Kwon | |
| 6,026,018 A | 2/2000 | Herdt et al. | |
| 6,097,629 A | 8/2000 | Dietrich et al. | |
| 6,122,191 A * | 9/2000 | Hirose et al. | 365/185.01 |
| 6,285,586 B1 | 9/2001 | Lung et al. | |
| 6,414,873 B1 | 7/2002 | Herdt | |
| 6,469,930 B1 * | 10/2002 | Murray | 365/185.08 |
| 7,110,293 B2 * | 9/2006 | Jung | 365/185.08 |
| 7,164,608 B2 | 1/2007 | Lee | |
| 7,269,054 B2 | 9/2007 | Kang et al. | |
| 7,280,397 B2 | 10/2007 | Scheuerlein | |
| 7,408,801 B2 | 8/2008 | Kang et al. | |
| 7,505,303 B2 | 3/2009 | Ashokkumar et al. | |
| 7,518,916 B2 | 4/2009 | Ashokkumar et al. | |
| 7,539,054 B2 | 5/2009 | Ashokkumar et al. | |

(Continued)

*Primary Examiner* — Michael Tran  
(74) *Attorney, Agent, or Firm* — Raywell Group, LLC

(57) ABSTRACT

The present invention discloses a 10T NVSRAM cell with a 6T SRAM cell with 4T Flash cell with one dedicated Flash-based Charger. In addition, a Pseudo-8T NVSRAM cell with a shared Flash-based Charger between two adjacent 8T NVSRAM cells at top and bottom in cell layout is also disclosed to further reduce cell size by 20%. As opposed to the prior art of 12T NVSRAM cell, the Store operation of the above two preferred embodiments use a DRAM-like charge-sensing scheme with Flash cell configured into a voltage follower ensured by the Flash-based Charger to obtain the final $\Delta V_{Q\text{-}QB} > 0.2V$ at Q and QB nodes of each SRAM cell to cover all the mismatched of parasitic capacitance in flash cell devices and layout for a reliable amplification by ramping up SRAM's VDD line and ramping down SRAM's VSS line.

45 Claims, 12 Drawing Sheets

(56) References Cited

U.S. PATENT DOCUMENTS

| | | |
|---|---|---|
| 7,663,917 B2 | 2/2010 | Cuppens et al. |
| 7,710,776 B2 | 5/2010 | Johal et al. |
| 7,760,540 B2 | 7/2010 | Still |
| 7,859,899 B1 | 12/2010 | Shakeri et al. |
| 7,890,804 B2 | 2/2011 | Mann et al. |
| 8,018,768 B2 | 9/2011 | Shih et al. |
| 8,036,032 B2 | 10/2011 | Scade et al. |
| 8,331,134 B2 | 12/2012 | Chiu et al. |
| 8,467,243 B1 * | 6/2013 | Shakeri et al. ........... 365/185.08 |

* cited by examiner

PSEUDO-8T NVSRAM CELL WITH A CHARGE-FOLLOWER

CROSS-REFERENCE TO RELATED APPLICATIONS

This application claims priority to U.S. Patent Application No. 61/720,385, filed on Oct. 30, 2012, commonly assigned, and hereby incorporated by references in their entireties herein for all purposes.

This application is related to U.S. Pat. No. 7,760,540, and U.S. patent application Ser. Nos. 14/037,356, 14/053,549, 14/058,227, and 14/059,618.

TECHNICAL FIELD OF THE INVENTION

The present invention relates to a preferred Pseudo-8T NVSRAM cell along with a Flash-based Charge-follower that takes a layout room of one flash row or of an active spacing between two adjacent Flash transistor source nodes in y-direction, thus no extra silicon area is required. Each Pseudo-8T NVSRAM cell further comprises one 6T LV SRAM cell and one 2T HV Flash cell in a paired 1T Flash string containing only one Flash transistor but with another one flash transistor used as a Charger for the HV supply of a Flash-based voltage follower in each individual string.

BACKGROUND OF INVENTION

Conventionally, a 12-transistor (12T) NVSRAM cell is made of one 6T SRAM cell and one 6T Flash cell. Each Flash cell comprises a paired 3T flash strings. Each flash string comprises three HV transistors with one flash transistor (1T) in the middle sandwiched by one top (1T) and one bottom (1T) HV Select transistors.

The conventional 12T NVSRAM uses a 2-step Write operation that uses FN-channel Erase scheme with flash gate tied to a negative voltage VNN as a first step to either decrease flash cell's channel threshold level Vt to $Vt0 \leq -2V$ initially followed by a second step of FN-channel Program scheme with the flash gate tied to a positive voltage VPP to conversely increase flash cell's Vt to a value of $Vt1 \geq +2V$ to obtain a large value of Vt difference from a erased state to a programmed state $\Delta Vt12 \geq 4V$ initially. With this big $\Delta Vt12 \geq 4V$, a superior NVSRAM Recall operation can be achieved at low VDD operation. For example, VDD can be as low as 1.2V.

But, one major disadvantage of the above 12T NVSRAM cell is the big cell size. A 6T HV Flash cell takes more silicon layout than a 6T LV SRAM cell layout typically. After a long P/E endurance cycle, the distance of the gap of $\Delta Vt$ of Erase and Program Vt becomes smaller, thus the big cell size of 12T NVSRAM may result in unreliable cell operations, especially for low 1.2V VDD operation.

Therefore, an improved NVSRAM cell design with reduced cell size by cutting transistor numbers or enhancing sharing in circuit design along with proper write operation and recall operation are desired and become objectives of the present invention.

SUMMARY OF THE INVENTION

The present invention discloses a 10T NVSRAM cell with a 6T SRAM cell coupled with a 4T Flash cell having one dedicated Flash-based Charger. In addition, a Pseudo-8T NVSRAM cell with a shared Flash-based Charger between two adjacent 8T NVSRAM cells to top and bottom in layout is also disclosed to further reduce cell size by 20%.

As opposed to the prior art of 12T NVSRAM cell, the Store operation for the about the 10T NVSRAM cell with a Flash Charger and Pseudo-8T NVSRAM cell can be operated using a DRAM-like Charge-sharing scheme. This Store operation is realized by configuring a Flash cell into a Voltage Follower ensured by a Charger to obtain the final $\Delta V_{Q\text{-}QB} > 0.2V$ at paired data nodes of Q and QB of each SRAM cell. This final voltage difference at Q and QB nodes $\Delta V_{Q\text{-}QB}$ is able to cover all the mismatched parasitic capacitance in the Flash cells and layout for a reliable amplification by ramping up SRAM's VDD line and ramping down SRAM's VSS line.

In certain embodiments, each 10T NVSRAM cell with a flash Charger of the present invention comprises one similar 6T SRAM cell but with one paired 1T Flash strings. Each of the 1T Flash string comprises only one Flash transistor as conventional NVSRAM cell but coupled to another one flash transistor used as a Charger (coupled to a common pumpWL signal line) for the HV supply of a Flash-based voltage follower in each individual string. This preferred Charger will supply more charges to Q and QB nodes through the paired Flash cell stored with two different Vts with $\Delta Vt12 \geq 1V$ if the pumpWL ramps to a higher voltage but limited by VPP. The $\Delta Vt12$ means the Vt difference between the paired flash cell after last program operation. The paired devices of the Charger are preferably made of the same Flash transistors with their gates tied to the common signal, pumpWL. More charges of the Charger can be generated by ramping the pumpWL signal to a higher value with the maximum value of VPP allowed in this NVSRAM design.

In addition, the higher $\Delta Vt12$ would not always generate the same $\Delta Vt12$ to the paired nodes of Q and QB, referred as $\Delta V_{Q\text{-}QB}$, of each SRAM cell. In other words, the 100% of $\Delta Vt12$ shown at Q and QB without reduction is only the Charger provides enough chargers during the ramping of pumpWL. Most of the time, the $\Delta V_{Q\text{-}QB} \leq \Delta Vt12$. One way to make the $\Delta V_{Q\text{-}QB} = \Delta Vt12$ is to increase the charge-coupling effect by increasing the pumpWL voltage and channel length of the paired pump flash transistors.

In one or more embodiments, the present 10T NVSRAM cell with a Flash Charger is a Pseudo-8T NVSRAM cell with one extra paired flash transistor coupled to a common pumpWL. Thus its cell size is effectively like a 10T NVSRAM cell without two big top and bottom Select transistors. Nevertheless, the effective cell size of the 10T NVSRAM cell with a Flash Charger is still smaller than the conventional 12T NVSRAM cell.

In a specific embodiment, the present invention provides a 10T NVSRAM cell with a Flash Charger made from one LV 6T SRAM cell and one HV 4T Flash cell. Each 4T Flash cell further includes one paired 2T NMOS Flash strings. Each 2T Flash string includes one Flash transistor and one dedicated Charger Flash transistor with its source node left floating. The Flash transistor and Charger Flash transistor are preferably made of the same flash type but with flexibility for different or same channel length. The same flash type means they can be made of either a 2-poly floating-gate type or a 1-poly charge-trapping SONOS and MONOS types, PMOS type or NMOS type.

In another specific embodiment, the present invention discloses a Pseudo-8T NVSRAM cell that includes one LV 6T SRAM cell, one paired 2T Flash cell, and one paired Flash-based Charger cell that is shared by two adjacent 8T NVSRAM cells without taking the extra room.

The Flash transistor and Flash-based Charger transistor are also preferably made of the same flash type but with flexibility for a different channel length in the 10T NVSRAM cell with a flash Charger. The same flash type means they can be made of either a 2-poly floating-gate type or a 1-poly charge-trapping SONOS and MONOS types, PMOS type or NMOS type.

In yet another specific embodiment, the present invention provides a method for either a 10T NVSRAM cell with a flash Charger or a Pseudo-8T NVSRAM cell to use a low-current FN-edge Program scheme to decrease both flash transistor Vts with a desired $\Delta Vt12 \geq 1V$ by applying a negative HV of VNN to the paired flash transistor gates and the paired flash transistors drain edges coupled with VSS and VDD respectively. The VSS and VDD are supplied directly by the paired Q and QB nodes from each corresponding 6T SRAM cell. The VDD can be as low as 1.2V.

In still another specific embodiment, the present invention provides a method for either a 10T NVSRAM cell with a flash Charger or a Pseudo-8T NVSRAM cell to use one preferred low-current FN-channel Erase scheme to increase the paired flash transistor Vts to a same preferred positive value of Vt1. This Vt1 is set to be higher than VDD by applying a positive HV of VPP to the paired Flash transistor gates along with VSS in both flash transistor channels. The grounded flash channels are supplied directly by setting both Q and QB nodes to VSS initially by each SRAM cell.

In yet still another specific embodiment, the present invention provides a method of Recall operation for either a 10T NVSRAM cell with a flash Charger or a Pseudo-8T NVSRAM cell to use a DRAM-like charge-sensing scheme that converts the $\Delta Vt12$ stored in a paired flash transistors configured into a Voltage follower to a $\Delta V_{Q\text{-}QB}$ at Q and QB nodes thought the aid of Flash-based Charger. Lastly, the small value of $\Delta V_{Q\text{-}QB}$ is fully amplified to VDD and VSS by 2 steps. The first step ramps up each SRAM's VDDP line for a first amplification operation and the second step ramps down SRAM's VSSP line subsequently to complete the whole SRAM's amplification operation. The role of the Flash-based Charger is to ensure $\Delta V_{Q\text{-}QB} = \Delta Vt12$.

In an alternative embodiment, the present invention provides a method of operating a Store operation through two steps. The first step uses the preferred FN-channel Erase scheme to increase the paired Flash transistor Vts to a same initial Vt1 with a desired value above VDD. The second step uses another preferred FN-edge Program scheme to decrease both Flash transistor Vts with a desired $\Delta Vt12 \geq 1V$.

In another alternative embodiment, the present invention discloses that the paired flash transistors are configured into a Voltage Follower along with the Flash-based Charger by making the $\Delta V_{Q\text{-}QB} \approx \Delta Vt12$ if the Charger generates enough HV charges by ramping up the Charger's Flash transistor gates to a HV below VPP during a Recall operation.

In yet another alternative embodiment, the present invention discloses that the Charger flash channel length can be flexibly increased to generate more coupling HV charges to Q and QB nodes to ensure the success of the Voltage Follower operation.

In still another alternative embodiment, the present invention discloses a preferred amplification method for both a 10T NVSRAM cell with a flash Charger or a Pseudo-8T NVSRAM cell by presetting the Q and QB nodes to VSS initially with a grounded FWL and ramping up the gates of Charge flash transistors first and then release the FWL to about 4V to transfer the coupling-generated charges to Q and QB nodes, and then ramping up SRAM VDD first followed by ramping down SRAM's VSS to complete the whole amplification cycle using a DRAM-like Charge-sensing scheme.

In yet still another alternative embodiment, the present invention discloses that the channel length of the paired Flash transistors have to be made long enough to prevent the channel punch-through due to $V_{DS}$ drop is more than 5V during the Charger operation.

In a specific embodiment, the present invention provides a 10T NVSRAM memory cell circuit with a pair of flash-based transistors as a charger. The 10T NVSRAM memory cell includes a SRAM cell. The SRAM cell includes two inverters cross-coupled to a first pass transistor and a second pass transistor commonly gated by a first word line and respectively coupled drains to a first bit line and a second bit line and sources to a first data node and a second data node. The first data node and the second data node respectively are outputted from the two inverters. Each inverter includes a PMOS device connected to a first power line and a NMOS device connected to a second power line. The first power line and the second power line are operated between a VDD power supply and ground and they are separated from a common Nwell node. The 10T NVSRAM memory cell also includes a Flash cell. The Flash cell includes a first cell string and a second cell string sharing a common P-sub. The first/second cell string includes a first/second Flash transistor and a first/second Charger transistor connected in series. The first Flash transistor has a first drain node coupled to the first data node. The second Flash transistor has a second drain node coupled to the second data node. The first Charger transistor has a first source node left floating. The second Charger transistor has a second source node left floating. The first Flash transistor and the second Flash transistor are commonly gated by a second word line. The first Charger transistor and the second Charger transistor are commonly gated by a pump word line. The first Charger transistor and the second Charger transistor are configured to ramp the pump word line up to a high voltage above the VDD level to generate charges and respectively pass through the first Flash transistor with a first threshold level and the second Flash transistor with a second threshold level to create a voltage level difference at the first data node and the second data node by subsequently ramping the second word line to the VDD level. The two cross-coupled inverters are operated to amplify the voltage level difference to a scale of VSS=0V at one of the first data node and the second data node and the VDD level at another one of the first data node and the second data node.

In another specific embodiment, the present invention provides a paired pseudo-8T NVSRAM memory cell circuit with a shared flash charger. The paired pseudo-8T NVSRAM memory cell includes a first pseudo-8T NVSRAM cell having a first flash source terminal and second flash source terminal and a second pseudo-8T NVSRAM cell having a third flash source terminal and fourth flash source terminal. The paired pseudo-8T NVSRAM memory cell includes a first Charger transistor and a second Charger transistor commonly gated by a pump word line. The first Charger transistor has a first charger drain node connected to the first flash source terminal and a first charger source node connected to the third flash source terminal. The second Charger transistor has a second charger drain node connected to the second flash source terminal and a second charger source node connected to the fourth flash source terminal. The first pseudo-8T NVSRAM cell and the second pseudo-8T NVSRAM cell are configured to be substantially same in a NVSRAM cell structure sharing a first common power line and separately a second common power line respectively operated between a VDD power supply and ground. The NVSRAM cell structure includes a SRAM cell comprising two inverters cross-coupled to a first pass transistor and a second pass transistor commonly gated by a first word line and respectively coupled drains to a first bit line and a second bit line and sources to a first data node and a second data node. The first data node and the second data node respectively are outputted from the two inverters. Each inverter includes a PMOS device connected to the first power line and a NMOS device connected to the second power line. The first power line and the second power line are separated from a common Nwell node. The NVSRAM cell structure further includes a Flash cell comprising a first cell string and a second cell string sharing a common P-sub. The first/second cell string includes a first/second Flash transistor. The first Flash transistor has a first drain node and a first source node. The first drain node is coupled to the first data node. The second Flash transistor has a second drain node and a second source node. The second drain node is coupled to the second data node. The first Flash transistor and the second Flash transistor are commonly gated by a second word line. The first/second source node of the first pseudo-8T NVSRAM cell is the first/second flash source terminal and the first/second source node of the second pseudo-8T NVSRAM cell is the third/fourth flash source terminal. The first Charger transistor and the second Charger transistor are configured to ramp the pump word line up to a high voltage above the VDD level to generate charges and use a charge-sensing scheme and voltage-follower operation for performing a Recall operation to write a Flash logic state represented by threshold levels of the first Flash transistor and the second Flash transistor in either the first pseudo-8T NVSRAM cell or the second pseudo-8T NVSRAM cell to corresponding SRAM logic state stored by voltage levels of the first data node and the second data node in corresponding the first pseudo-8T NVSRAM cell or the second pseudo-8T NVSRAM cell.

Further, it will be shown in this description, the paired pumpWL Flash transistors can be shared by top and bottom 6T SRAM cells. And this pumpWL Flash transistor is formed between the spacing of the top Flash and bottom Flash transistors. As a result, the effective size of the sharing a PumpWL line in the 10T NVSRAM cell is like an 8T NVSRAM cell with the smallest cell size so far being realized.

The program and erase operations of the paired flash transistors preferably use the FN-channel erase with the common gate tied to a VPP to move both Flash's transistors to a same positive value larger than VDD. And then use another FN-edge program scheme to decrease respective Flash transistor's Vt with a preferred $\Delta Vt12 \geq 2V$. It is better to have one Vt below VDD and the other is higher than VDD when the FWL is ramped to only VDD during NVSRAM cell Recall operation. If FWL can be ramped above VDD, then both Vts of the paired transistors can be erased to higher value initially. Anyway, the preferred ramped FWL voltage is between the two different stored Vts of the flash transistor and is less than the coupled source voltage generated by the pumpWL to ensure the desired function of s voltage follower which works normally as long as the gate voltage is lower than the drain voltage. The drain becomes the source node of the flash transistor of this Pseudo-8T NVSRAM cell.

THE BRIEF DESCRIPTION OF THE DRAWINGS

DETAILED DESCRIPTION OF THE INVENTION

The present invention is related to improved cell architecture for NVSRAM memory device. Merely by example, the invention provides a 10-transistor (10T) NVSRAM cell with a flash Charger or a Pseudo-8T NVSRAM cell to reduce cell size from typical 12T NVSRAM cell. All key operations of the 10T NVSRAM cell with a flash Charger are provided under one or more operation schemes, no matter what the Flash cell within the NVSRAM cell is made by 1-poly SONOS or MONOS charge-trapping type, or 2-poly NMOS or PMOS floating-gate type.

Figure 1A:
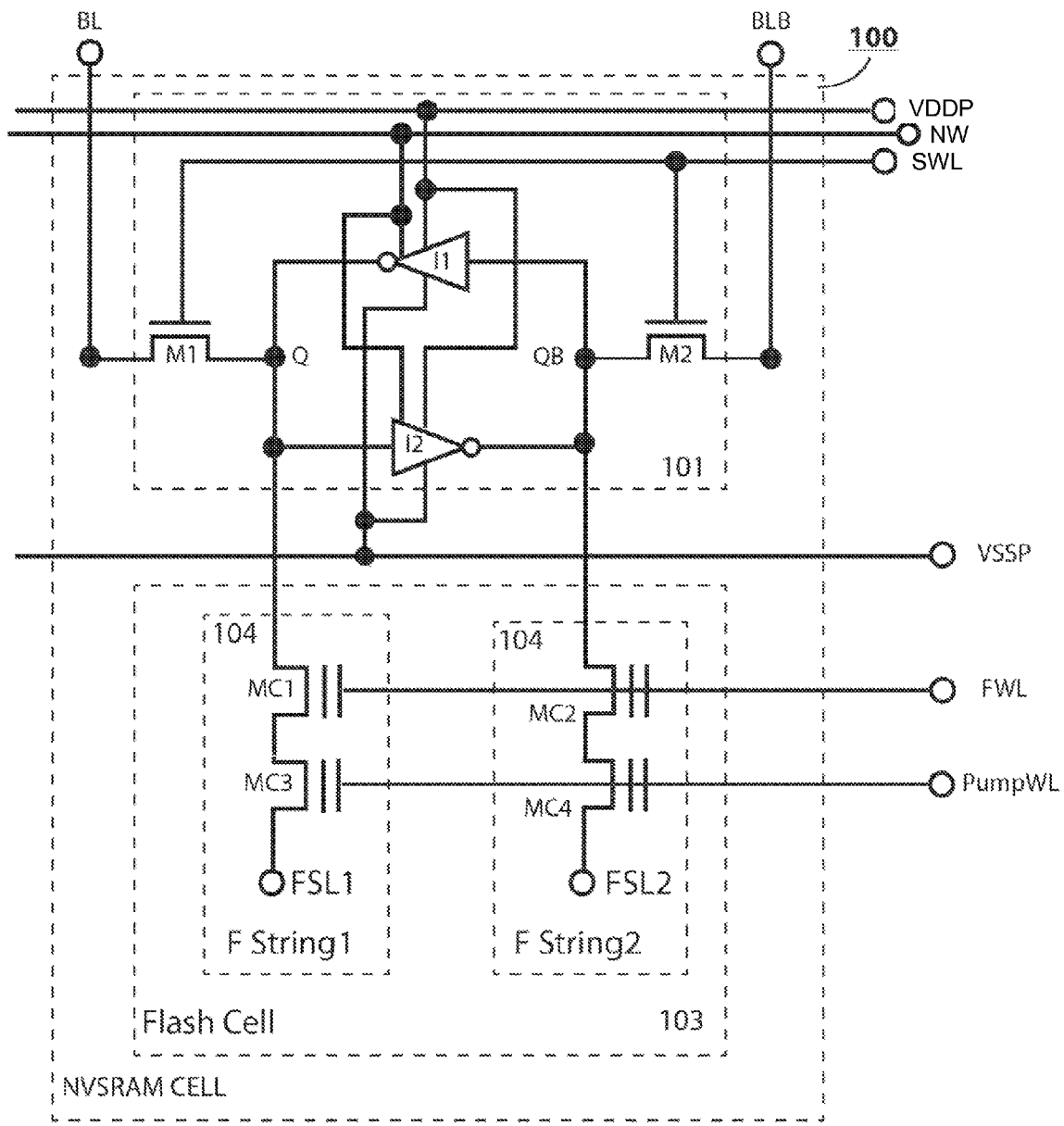
FIG. 1A is a circuit diagram of a 2-poly NMOS 10T NVSRAM cell with one paired flash Charger transistor as a charger according to an embodiment of the present invention.

FIG. 1A shows a first preferred embodiment of a 2-poly NMOS 10T NVSRAM cell with a flash Charger used for NVSRAM memory device of the present invention. The 10T NVSRAM cell 100 comprises one 6T LV SRAM cell 101 and one 4T NMOS 2-poly Flash cell 103. Each 4T NMOS 2-poly Flash cell comprises two fully symmetrical 2T NMOS 2-poly Flash strings, 104. Each String further comprises one 2-poly NMOS Flash transistor MC1 and one Flash-based Charger transistor, MC3, with its source node, FSL1, left floating in FString1 and another Flash transistor MC2 and Charger transistor, MC4, in with its source node, FSL2, left floating in FString2. MC1 and MC2 are commonly gated by a Flash word line FWL. MC3 and MC4 are commonly gated by a PumpWL signal. Each SRAM cell 101 is configured to couple a common power line VDDP to PMOS devices in both Inverters I1 and I2 and another power line VSSP to NMOS devices in both I1 and I2, which are both separated from a common Nwell region connected at NW node. The two common power lines are operated between a regular VDD power supply and ground level VSS=0V. The LV NMOS devices M1 and M2 drain nodes are coupled to the bit lines BL and BLB, source nodes coupled to the paired data node Q and QB at two outputs of I1 and I2. M1 and M2 have their commonly gates connected to SRAM word line SWL.

Unlike all prior art 12T NMOS NVSRAM cell, there are no top 2-poly NMOS HV Select transistor and bottom 2-poly NMOS HV Select transistor. Each paired NMOS 2-poly Flash drain nodes are preferably connected to each paired data nodes of Q and QB of each 6T CMOS LV SRAM cell 101 directly. In an embodiment, the parasitic capacitance on both Q and QB nodes and the connections to Flash drain nodes of MC1 and MC2 are substantially equal and fully tracking to set up a good foundation for this preferred 10T NVSRAM cell with a common flash Charger using a DRAM-like charge-sensing scheme for Recall operation. Therefore, when initial charges are generated by the common flash Charger at the two Flash drain nodes with only a minor difference, it can still be reliably amplified due to perfect or near perfect tracking in capacitance.

Since the Charger transistors MC3 and MC4, although they are the same type as the Flash transistors MC1 and MC2, are not used for storing logic data, this 10T NVSRAM cell with a flash Charger actually can be viewed as a Pseudo-8T NVSRAM cell. This 2-poly Pseudo-8T NVSRAM cell uses a +18V VPP to increase Vts of NMOS flash transistor MC1 and MC2 during an erase operation and uses a −18V VNN to decrease the NMOS flash transistor Vts during a program operation.

Now, the operations of this 10T NVSRAM cell with a Flash Charger within a NVSRAM memory (including M rows×N columns of array of NVSRAM cells) will be illustrated below.

1) SRAM operation: In this operation, each Flash cell is preferably isolated from each corresponding SRAM cell. In order to perform this operation, the biased conditions are preferably set below:

A) SWL=VDD applied in a single selected SRAM WL for the selected SRAM cells but SWL=VSS applied in non-selected N−1 WLs for the non-select SRAM cells.
B) VDDP=VDD and VSSP=VSS.
C) FWL=VSS to isolate both MC1 and MC2 flash transistors from each corresponding SRAM cell if the Vts of MC1 and MC2 are all positive.
D) FWL=−2V to isolate both MC1 and MC2 flash transistors from each corresponding SRAM cell if one of the Vts of MC1 and MC2 is negative but not lower than −2V, where −2V is merely an example of a lower boundary of preferred Vt values the flash transistors.

2) Flash operation: This includes two sub-operations such as a FN-channel Erase operation to increase both paired Flash transistor Vts with a same value Vt≥VDD and a FN-edge Program operation to decrease the paired Flash transistor Vts with a desired ΔVt12≥1V. Accordingly, the biased conditions for operating the Flash cell are explained below:

A) FN-channel Erase operation: Using a preferred FN-channel scheme to increase the paired flash transistor Vts to a value of Vt1≥VDD. The bias conditions for the FN-channel Erase operation are listed in Table 1 below.

TABLE 1

| Erase | VDDP | VSSP | BL | BLB | SWL | Q | QB | FWL | Pump WL |
|---|---|---|---|---|---|---|---|---|---|
| 1st step: Preset | VSS | VSS | VSS | VSS | VDD | VSS | VSS | X | X |

TABLE 1-continued

| Erase | VDDP | VSSP | BL | BLB | SWL | Q | QB | FWL | Pump WL |
|---|---|---|---|---|---|---|---|---|---|
| 2nd step: Erase | VSS | VSS | VSS | VSS | VDD | VSS | VSS | VPP | X |

In a first Preset step, the Drain nodes of MC1 and MC2 are connected to Q and QB respectively. Since Q=QB=VSS initially, thus MC1 drain node and MC2 drain node are at VSS. In a second Erase step, the FWL is ramped up to a positive HV of VPP, ranging from +15V to +18V. As a result, both flash transistors Vts would be increased to a same erased value of Vte after a predetermined erase time less than 5 ms, denoted by Vt1 (MC1)=Vt2(MC2)=Vte≥VDD, regardless of their old Vts in last program. If VDD=1.8V, then Vt1(MC1)=Vt2(MC2)=Vte≥1.8V.

B) FN-edge Program operation: Using a preferred FN-edge scheme to decrease the paired Flash transistor Vts with a desired ΔVt12≥1.0V. The bias conditions for the FN-edge Program operation are listed in Table 2 below.

TABLE 2

| Program | VDDP | VSSP | BL | BLB | SWL | Q | QB | FWL | Pump WL |
|---|---|---|---|---|---|---|---|---|---|
| 1st step Preset | VDD | VSS | X | X | VSS | VSS/VDD | VDD/VSS | VSS | X |
| 2nd step Program | VDD | VSS | X | X | VSS | VSS/VDD | VDD/VSS | VNN | X |

In Preset step, the drain nodes of MC1 and MC2 are directly connected to Q and QB respectively.

Case 1: With Q=VDD and QB=VSS initially, then MC1 drain node is at VDD and MC2 drain node is at VSS. The MC1 drain edge gets a higher Erase voltage than MC2 drain edge. In the second Program step, the FWL is ramped down to a negative HV of VNN, ranging from −15V to −18V. As a result, both Flash transistor Vts would be decreased to two different values after a predetermined Program time less than 5 ms. MC1 Vt will decrease more due to a larger tunneling electric field at the drain edge. As a result, the desired Vt1(MC1)≤1V and Vt2(MC2)≥1.8V for 1.8V VDD operation.

Case 2: Conversely, with Q=VSS and QB=VDD initially, then MC1 drain node is at VSS and MC2 drain node is at VDD. As a result, MC2 drain edge gets a higher erase voltage than MC1 drain edge. In the second Program step, the FWL is ramped down to a negative HV of VNN, ranging from −15V to −18V. As a result, both Flash transistor Vts would be decreased to two different values after a predetermined Program time less than 5 ms. MC2 Vt will decrease more due to a larger tunneling electric field at the drain edge. As a result, the desired Vt1(MC1)≥1.8V, but Vt2(MC2)≤0.8V for 1.8V VDD operation. The desired Vt difference between MC1 and MC2 flash transistors in the 10T NVSRAM cell ΔVt12≥1.0V.

3) Store operation: This operation is defined as the FN-edge Program operation as explained above. After the preferred FN-edge Program operation, the logic state of each 6T SRAM cell into each corresponding 4T Flash cell of the 10T NVSRAM cell with a flash Charger. But before the Store operation, an Erase operation under FN-channel scheme should be performed to get the same initial positive Vts for both MC1 and MC2 flash transistors.

There are two SRAM's logic states: a) State "1": Q=VDD and QB=VSS, b) State "0": Q=VSS and QB=VDD. Correspondingly, there are two Vt states, Vt1 and Vt0, associated with each of two Flash transistors MC1 and MC2, where Vt0<Vt1 and preferably Vt0 is a negative value and Vt1 is a positive value for a superior Recall operation. The bias conditions for operating the Store operation is explained in Table 3 below.

operation is explained below with respect to the graph of FIG. 4 and the erase graph shown in FIG. 3.

Figure 3:
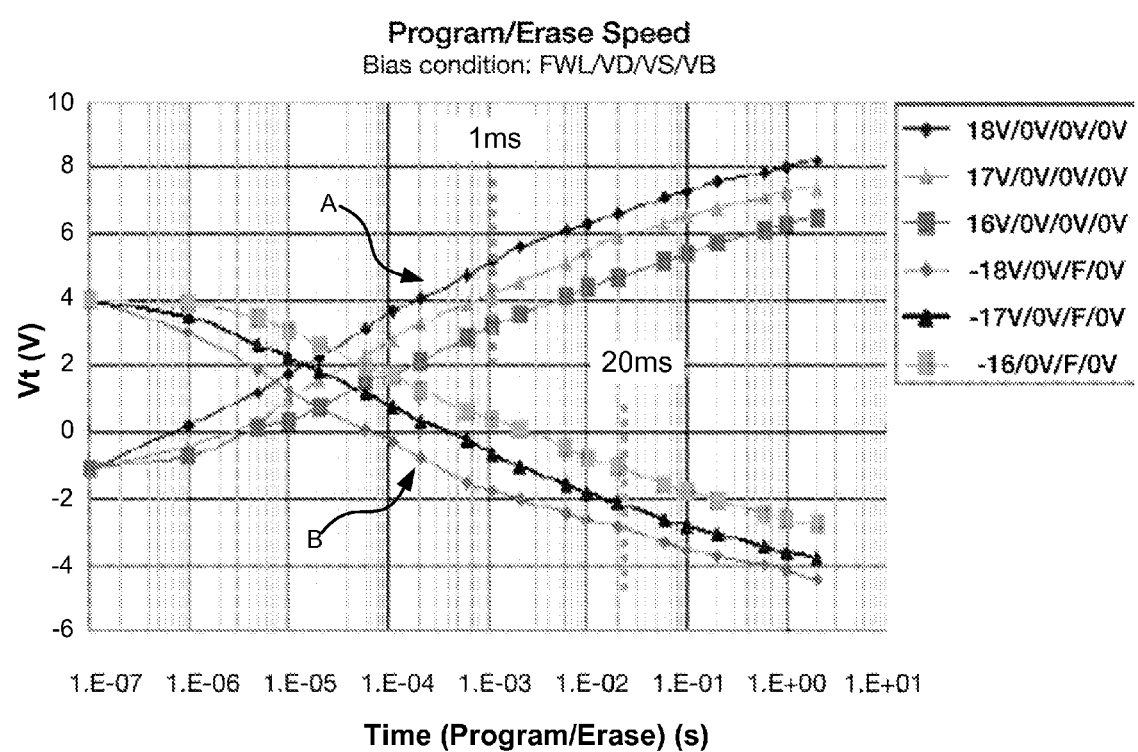
FIG. 3 is a diagram showing a NMOS Flash transistor's threshold level Vt distribution versus time for a FN-channel Program operation using a positive VPP voltage to increase Vt and for a FN-channel Erase operation using a negative VNN to decrease Vt in accordance of the present invention.

FIG. 3 shows a NMOS Flash transistor Vt distribution vs. time for both 10T NVSRAM cell with a flash Charger and Pseudo-8T NVSRAM cell FN-channel program and FN-channel erase operations. The conventional FN-channel Program graph will be conversely used as the preferred FN-channel Erase operation of both 10T NVSRAM cell with a flash Charger and Pseudo-8T NMOS NVSRAM cell to increase both Vt1 and Vt2 of MC1 and MC2 NMOS flash cells with a desired positive Vt. As shown, with 1V difference in gate but with same channel voltage, after 1 ms, the ΔVt can be 1V difference. Secondly, with 1 ms, the Flash transistor Vt

TABLE 3

| Store | VDDP | VSSP | BL | BLB | SWL | Q | QB | Vt (MC1) | Vt (MC2) | FWL | Pump WL |
|---|---|---|---|---|---|---|---|---|---|---|---|
| 1$^{st}$ step Erase | VDD | VSS | VSS | VSS | VDD | VSS | VSS | Vt1 | Vt1 | VPP | VSS |
| 2$^{nd}$ step State "0" Program | VDD | VSS | X | X | VSS | VSS | VDD | Vt1 | Vt0 | VNN | VSS |
| 2$^{nd}$ step State "1" Program | VDD | VSS | X | X | VSS | VDD | VSS | Vt0 | Vt1 | VNN | VSS |

There are three kinds of Store operations associated with the 10T NVSRAM cell with a flash Charger in accordance with the present invention.

a) Auto-Store operation: This operation is performed upon the regular VDD lower loss. Every SRAM cell's data has to be written into its corresponding NVM Flash cell automatically in each 10T NVSRAM cell with a flash Charger.

b) Software-Store operation: This operation is performed upon the call of Software-Store command controlled initiated by the off-chip MCU. Usually, it involves a sequence of defined steps.

c) Hardware-Store operation: This operation is performed upon the call of hardware-Store command controlled by one pin and initiated by the off-chip MCU. Usually, it also involves a sequence of defined steps.

After each Store operation is performed by using the FN-channel scheme, then the Vt values and center value of two Vts of both MC1 and MC2 would be increased. Since both channels of MC1 and MC2 are held at VSS voltage with respect to a VPP voltage at gate, both MC1 and MC2 would get high tunneling electric field to result in the tunneling effect. Thus, a plurality of electrons would be injected into the floating-gate layer of both MC1 and MC2. As a result, both MC1 and MC2 Vts would become a high positive value of Vt1. In this 10T NVSRAM cell with a flash Charger, it preferably sets the Vt1 of both MC1 and MC2 to be higher than the VDD level in the initial "erase" operation. Later on, the subsequent FN-edge program operation would decrease one of the paired Flash transistor Vts lower than the VDD level due to the higher edge tunneling electric field while another one still higher than the VDD level, to generate the ΔVt12. In this manner, when FWL is ramped to the VDD for a Recall operation, one of Flash transistor Vt remaining higher than the VDD level would not be turned on.

In an embodiment, the FN-edge Write (program) operation is used for this 10T NVSRAM cell with a flash Charger (or a Pseudo-8T NVSRAM cell). The detail description of the can be increased above positive 2V with gate voltage of 18V. This is used by this invention to set the paired flash Vt to be a positive value above VDD of 1.8V operation.

Figure 4:
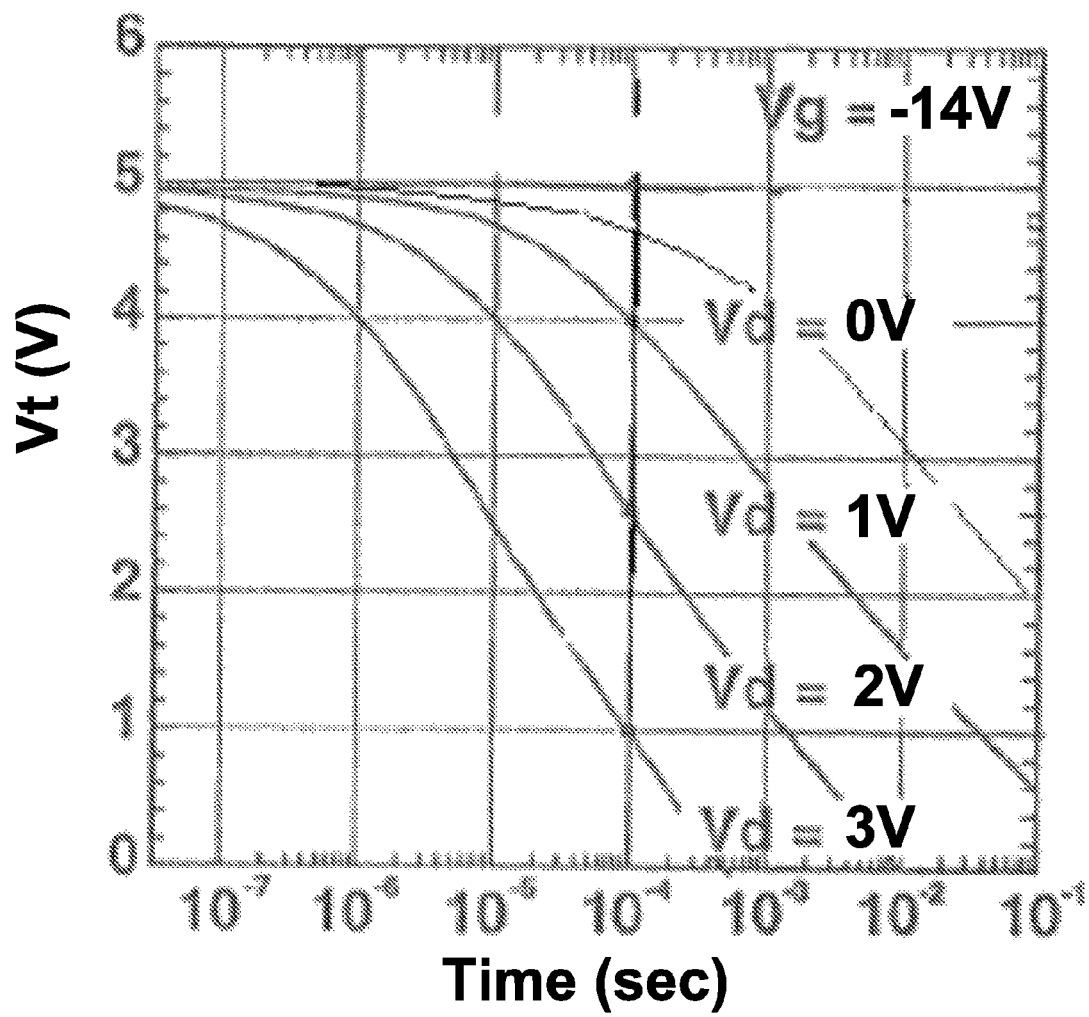
FIG. 4 is a diagram showing another Flash transistor's threshold level Vt distribution versus time for a FN-edge Program operation to decrease both Vts of flash cells with a desired $\Delta Vt \geq 1V$, regardless of 1-poly or 2-poly flash type transistors in accordance with the present invention.

Conversely, FIG. 4 shows the graph of a low-current FN-edge program as defined in the present invention to decrease the Vt of flash transistors of MC1 and MC2 for the present 10T NVSRAM cell with a flash Charger and Pseudo 8T NVSRAM cell. As shown, with 1V difference in flash channel with a same gate voltage of −14V, after 1 ms, the ΔVt can be 1V difference. Secondly, with 1 ms, the Flash transistor Vt can be decreased with a ΔVt>1.5V, which is larger than 1V as produced by using FN-channel scheme. In other words, the FN-edge scheme has a stronger tunneling electric field than FN-channel scheme. This FN-edge is used by this invention to set one of the paired flash Vts to be lower VDD or even negative at VDD of 1.8V operation.

Assuming the initial is a SRAM's logic "0" state with Q=VSS and QB=VDD, then the drain node of MC1=VSS but MC2=VDD. Thus MC2 drain node has VDD voltage higher than MC1 VSS. MC2 will get stronger electric field at MC2's drain edge than MC1 drain edge. As a result, the MC2 Vt will get decreased in a faster manner than the decline rate of MC1 Vt. The initial Vt of MC1 and MC2 is the same 5V, but after a pre-determined Erase time, the MC1 and MC2 Vts would end up with a difference ΔVt12, depending on the program time, VDD and VNN values.

If VDD is at 1V operation with FWL applied −16V and an initial 5V Vt1, by referring to the FIG. 4, after about 5 ms, both cells' Vts will have about 1.5V difference between MC1 Vt of −0.3V and MC2 Vt of 1.2V. There are 2 volts difference between −14V in FIG. 4 and the preferred FWL of −16V. Thus, the Vt decline of both MC1 and MC2 are faster. The edge electric field of −16V with 1V at drain and floating source is equivalent to −14V at floating gate with +2.5V at MC2 drain with respect −14V at floating gate with 1.5V at MC1 drain node and a floating source. When the value of FWL ramps to 1.2V VDD in Recall operation, only one flash transistor MC1 is turned on but the other flash transistor MC2 is turned off.

With the pumpWL is ramped to 4V or higher but less than the VPP voltage, a plurality of HV coupling charges would be generated in both channels of MC3 and MC4 and are distributed to the N-active junctions between MC1 and MC3 or MC2 and MC4 and the source junctions of FSL1 and FSL2 as well as Q and QB parasitic capacitance.

As a conclusion, $\Delta Vt12 \approx 1.5V$ for a FN-edge Write operation at VDD=1V after 5 ms. Through the voltage follower of MC1 and MC2, the $\Delta V_{Q\text{-}QB}$ would be generated to Q and QB nodes with a reduction. The ultimate goal is to get $\Delta Vt12=\Delta V_{Q\text{-}QB}$. But in reality, as long as $\Delta V_{Q\text{-}QB} \geq 0.2V$, the correct state of Flash pairs can be amplified and resumed by the SRAM cell to a full digital the VDD level and VSS. In this preferred 10T NVSRAM cell Recall operation, a simulation shows the minimum $\Delta V_{Q\text{-}QB} \geq 0.2V$ is more reliable to cover all the mismatches in parasitic capacitances in Q and QB nodes. To increase $\Delta V_{Q\text{-}QB}$, the Charge flash transistor MC3 or MC4 channel length has to be increased to induce the HV charges for the Flash Voltage follower.

Therefore, the 10T NVSRAM cell with a flash Charger of FIG. 1A is to couple VSSP line of the SRAM cell 101 to a VDD before the FWL is ramped to VDD. In this manner, the mismatch of both NMOS devices of the SRAM cell can be also neglected.

After FWL ramped to VDD to successfully couple the generated charges to Q and QB nodes from MC1 and MC2 flash transistors storing two different Vts, then VDDP line of the SRAM cell 101 is amped to VDD to amplify the $\Delta V_{Q\text{-}QB}$ first and then followed by a ramp-down of VSSP line to further amplify the detected small $\Delta V_{Q\text{-}QB}$ on Q and QB nodes due to $\Delta Vt12$. As a result, the small detected $\Delta V_{Q\text{-}QB}$ at Q and QB would be amplified to a full VDD and VSS values.

Now, the Recall operation of this 10T NVSRAM cell with a flash Charger is explained below. As opposite to the conventional 12T NVSRAM cell using the SRAM-like current charging scheme to charged up with a different voltages on nodes Q and QB, $\Delta V_{Q\text{-}QB}$ due to the $\Delta Vt12$ stored in paired flash transistors with initial Q=QB=VSS and MC1 Vt<MC2 Vt. This 10T NVSRAM cell with a flash Charger (cell 100 in FIG. 1A) uses a DRAM-like charge-sensing scheme and Flash Charger circuit to make $\Delta V_{Q\text{-}QB} > 0.2V$. The Recall operation is divided into six steps as shown in Table 4 and referenced to simulation results (FIG. 5B) based on circuit in FIG. 5A shown below.

The above VPP1 voltage is defined to be lower than VPP=18V. But VPP1 can be any voltage higher than VDD but less than VPP as long as the coupled HV in MC3 and MC4 are higher enough to maintain a normal Voltage Follower operation. That means the coupled channel voltage in MC3 and MC4 have to be high than the gate voltage of FWL. In an alternative embodiment, during the two-step SRAM amplification FWL can be coupled to a negative bias substantially smaller than the lowest Vt level of the paired Flash transistors to ensure the SRAM amplification successfully amplify the voltage difference between the Q and QB nodes to full digital VDD/VSS level.

Figure 5A:
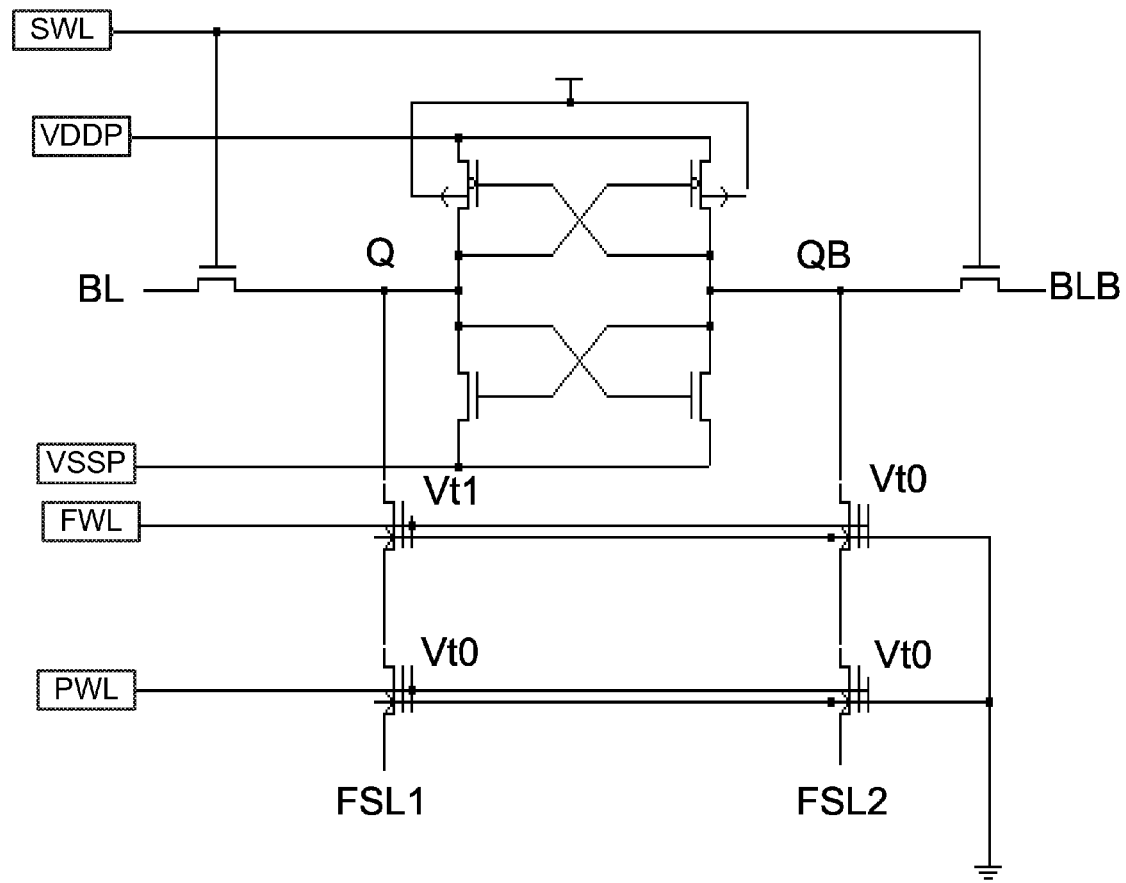
FIG. 5A is a simulation circuit of a 10T NMOS 2-poly NVSRAM cell with one paired flash transistor as a Charger for performing Recall operation in accordance with the present invention.

FIG. 5A is a simulation circuit based on a 10T 2-poly NMOS NVSRAM cell in accordance of the present invention. The simulation is to demonstrate the Recall operation of the 10T NVSRAM cells for FIG. 1A, FIG. 1B, and FIG. 1C. The difference is the VPP voltage applied to the FWL line. For 1-poly 10T NVSRAM cell shown in FIG. 1B, the highest coupling FWL voltage is limited by +10V, but +18V can be applied for the 2-poly NMOS 10T NVSRAM cell shown in FIG. 1A and the 2-poly PMOS 10T NVSRAM cell shown in FIG. 1C. As shown in FIG. 5A, the PMOS devices in two Inverters are coupled to VDDP line and the NMOS devices are coupled to VSSP line. Both Flash transistors respectively stored Vt1 and Vt0 threshold levels are commonly gated to FWL. Both Charger transistors stored Vt0 threshold level and commonly coupled to gate voltage PWL along with two sources FSL1 and FSL2 at float.

Figure 5B:
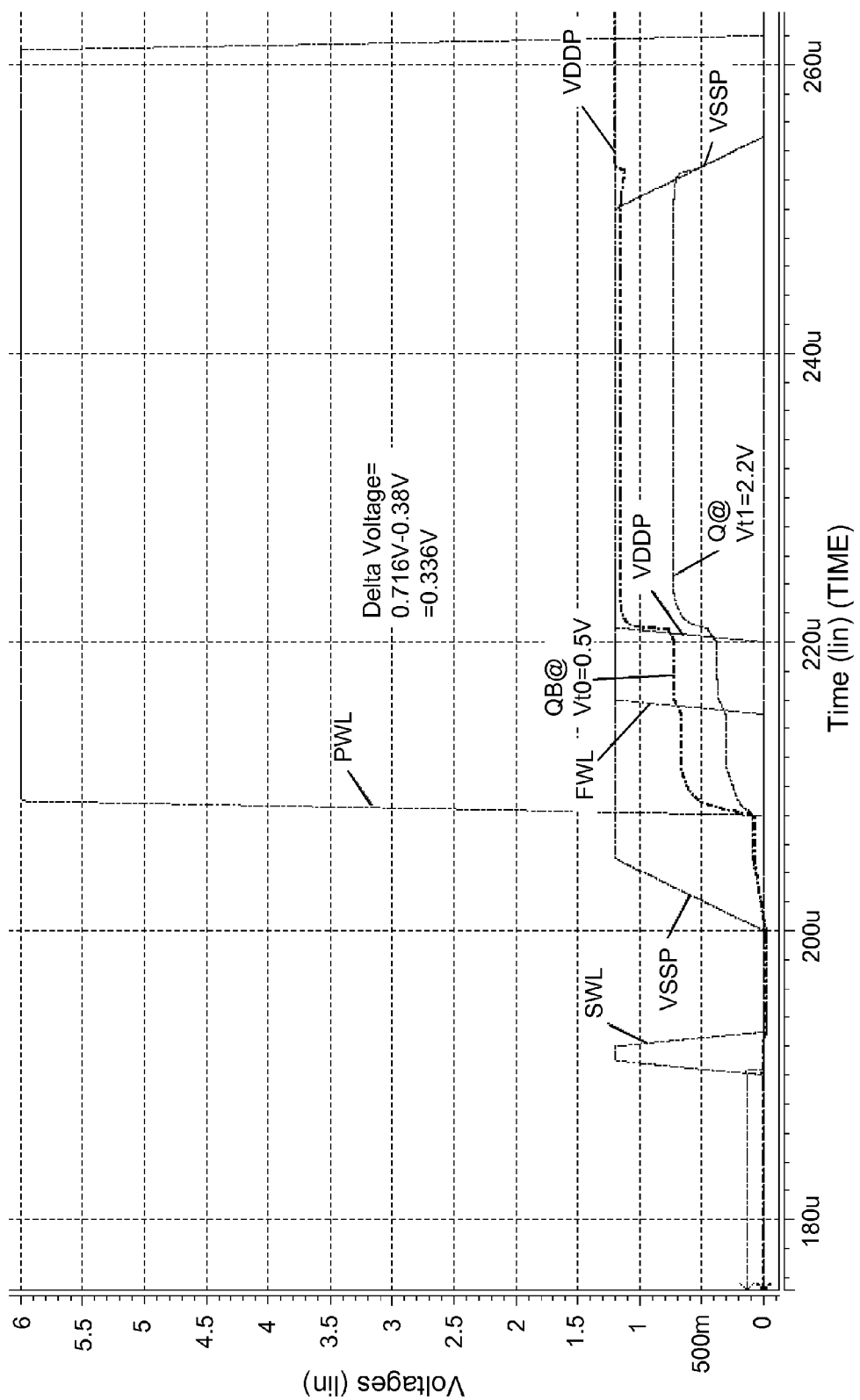
FIG. 5B is a chart showing simulation result based on the simulation circuit of FIG. 5A at one selected threshold level setting in accordance with the present invention.

FIG. 5B shows an NMOS, 2-poly, 10T NVSRAM's simulation result of the present invention under assumptions of VDD=1.2V, MC1 Vt1=2.2V but MC2 Vt2=0.5V and $\Delta Vt12=1.7V$. As shown, several Recall simulation waveforms of the 10T NVSRAM cell of FIG. 1A are illustrated and divided in several steps, referring to Table 4 above.

A first step is to initializing SRAM cell to set SRAM data nodes Q=QB=VSS. This is done at beginning of time line by pulsing the SWL. It is turned on (with VDD) for about 10-20 μs and off along with setting BL=BLB=VSS. Both power lines VSSP and VDDP are at VSS. Flash cell's FWL and PumpWL lines are also set to VSS.

At about 200 μs in time line, VSSP line is first ramped up from VSS to the VDD=1.2V to start a second step for setting SRAM cell ready for the DRAM-like charge-sensing scheme Recall operation. When ramping VSSP, the VDDP is maintained at VSS set initially along with each data node Q and QB

TABLE 4

| Recall | First step | Second step | Third step | Fourth step | Fifth step | Six step |
|---|---|---|---|---|---|---|
| Q | VSS | V1 | V1' | VDD/V3 | VDD/VSS | VDD/VSS |
| QB | VSS | V2 | V2' | V3/VDD | VSS/VDD | VSS/VDD |
| BL | VSS | X | X | X | X | High |
| BLB | VSS | X | X | X | X | Low |
| SWL | VDD pulse | VSS | VSS | VSS | VSS | VDD |
| VDDP | VSS | VSS | VSS | ramps to VDD | Stays at VDD | VDD |
| Pump WL | VSS | Ramps to VPP1 | Stays at VPP1 | Stays at VPP1 | Stays at VPP1 | VSS |
| VSSP | VSS | Ramps VDD | VDD | VDD | Ramps VSS | VSS |
| FWL | VSS | VSS | Ramps VDD | Stays at VDD | Stays at VDD | VSS |
| Function | SRAM initial set Q = QB = VSS | Detect $\Delta Vt12$ coupling | $\Delta V_{Q\text{-}QB}$ appears and QB | $1^{st}$ VDD amplification by VDDP | 2nd VSS amplification by VSSP | Back to SRAM operation |

Where V1' > V1, V2' > V2, V3 > max of V1 and V2, kept at VSS. The reversed power setting for VSSP and VDDP above help to lock out leakage paths for the paired nodes of Q and QB. At this stage, FWL remains at VSS. At around 208 µs in time line, the PumpWL line is also ramped up to a high voltage VPP1 (about 6V in this simulation) which is substantially higher than the VDD=1.2V but still much smaller than VPP (+10V for 1-poly transistor, +15V~18V for 2-poly transistor). The high voltage at PumpWL will induce a punch-through-like charge transfer from drain node of the Flash transistor to reach the Q or QB node to give the charges thereof a boost. Due to Vt difference of MC1 and MC2, the charges at Q and QB (at this moment) also show a difference (of about 0.35V). High PumpWL voltage is aiming for generating charges through a coupling from the Charger's gate to their channels connected to sources of the paired Flash transistors for assisting detection of the threshold level Vt difference in the two Flash transistors.

Next at about 215 µs in time line, the third step starts with FWL ramped from VSS to VDD=1.2V with PumpWL stayed at 6V in this simulation. Due to the difference of Vts stored in MC1 and MC2, the Channels would be boosted (by the PumpWL) to generate different voltages at Q and QB. In this simulation, MC1 Vt=Vt1=2.2V but MC2 Vt=Vt0=0.5V.

As a result, the QB becomes about 0.65V but Q about 0.3V after ramping PWL to 6V at ~208 µs before FWL ramping. At ~215 µs, the QB further becomes 0.7V and Q increases to 0.4V after FWL is ramped to VDD 1.2V. The reason the Q node charges are less than QB charges because MC1 Vt is higher than MC2. The $\Delta V_{Q-QB} \approx 0.4V$.

Later at 220 µs time line, when VDDP line is ramped to a full VDD from VSS to enter fourth step Recall operation, the first SRAM amplification increases $\Delta V_{Q-QB}$ from ~0.4V to 0.5V up to 245 µs in time line. When the second SRAM amplification is performed by ramping VSSP line down to ground VSS at 250 µs (the fifth step), the Q node becomes VSS at about 256 µs but QB remains at the VDD 1.2V. As a result, the logic state of the paired flash transistors of MC1 and MC2 are recalled into each corresponding SRAM cell and amplified into a full digital VDD level and VSS 0V. Finally in sixth step, the bias conditions are resetting FWL, VSSP, and PumpWL to VSS=0V, resetting VDDP and SWL to VDD to return to a SRAM operation.

Figure 1B:
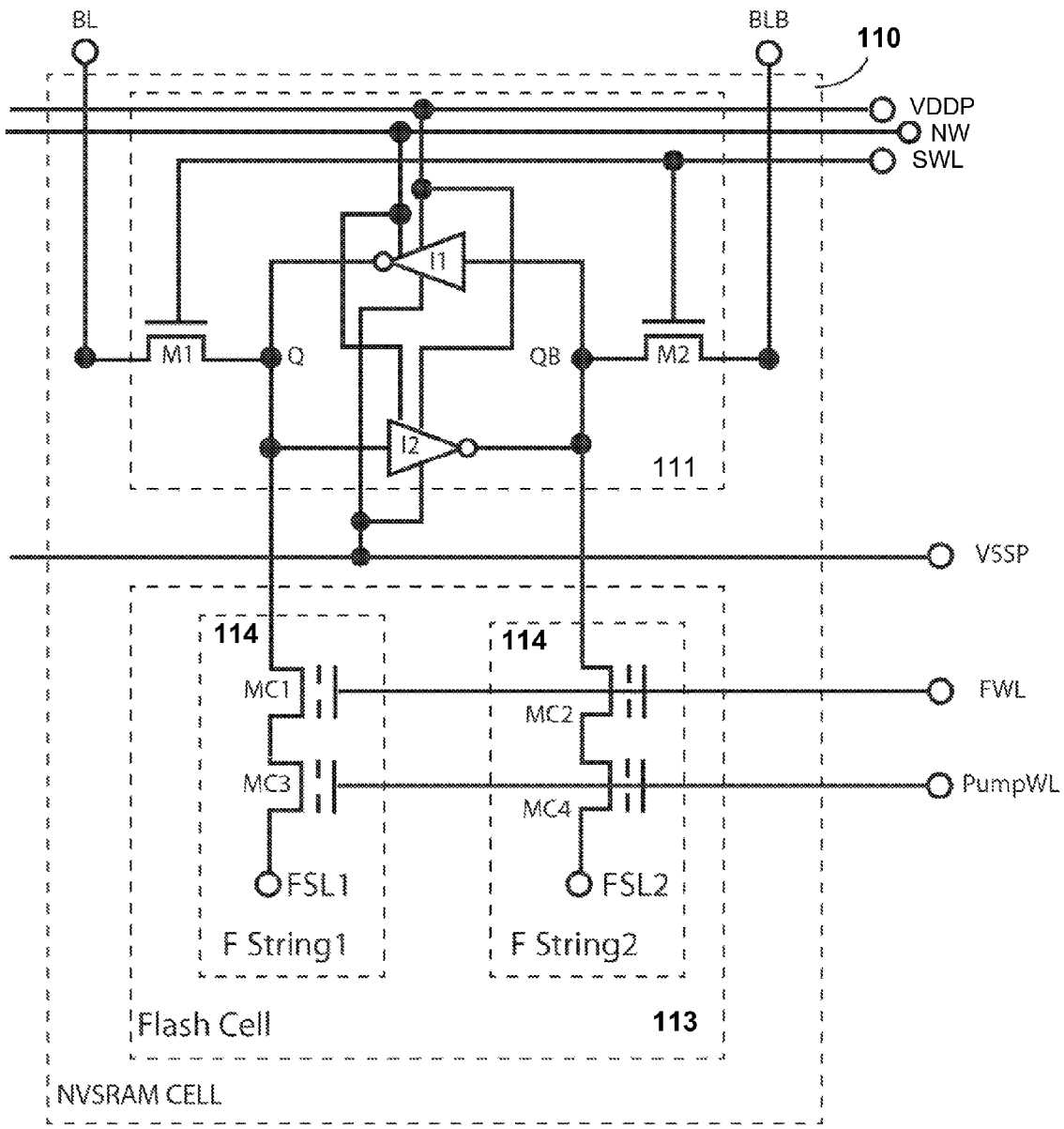
FIG. 1B is a circuit diagram of a 1-poly NMOS 10T NVSRAM cell with one paired flash Charger transistor as a charger according to an embodiment of the present invention.

FIG. 1B shows a second preferred embodiment of a 1-poly NMOS 10T NVSRAM cell with a flash Charger of the present invention. The 1-poly NMOS 10T NVSRAM cell 110 comprises one 6T LV SRAM cell 111 and one 4T NMOS 1-poly Flash cell 113. The SRAM cell 111 is substantially the same as the SRAM cell 101 in terms of two inverters I1 and I2 made by both NMOS and PMOS devices respectively coupled to two power line VDDP and VSSP, both being electrically separated from a node NW coupled to a common Nwell region of the SRAM cell 111. Each 4T NMOS 1-poly Flash cell comprises two fully symmetrical 2T NMOS 1-poly SONOS or MONOS type Flash strings 114. Unlike all prior art 12T NMOS NVSRAM cell, each preferred 2T NMOS 1-poly Flash string comprises only one NMOS 1-poly Flash transistor (1T) with one flash transistor (1T) acting as a Charger with its source node left floating without the top 1-poly NMOS HV Select transistor and the bottom NMOS 1-poly HV Select transistor. Each paired NMOS 1-poly Flash drain nodes are preferably connected to each paired nodes of Q and QB of each 6T CMOS LV SRAM cell directly. This 1-poly 10T NVSRAM cell uses a +18V VPP to increase NMOS Flash transistor Vt during the erase operation and a −18V VNN to decrease NMOS Flash transistor Vt during program operation.

Figure 1C:
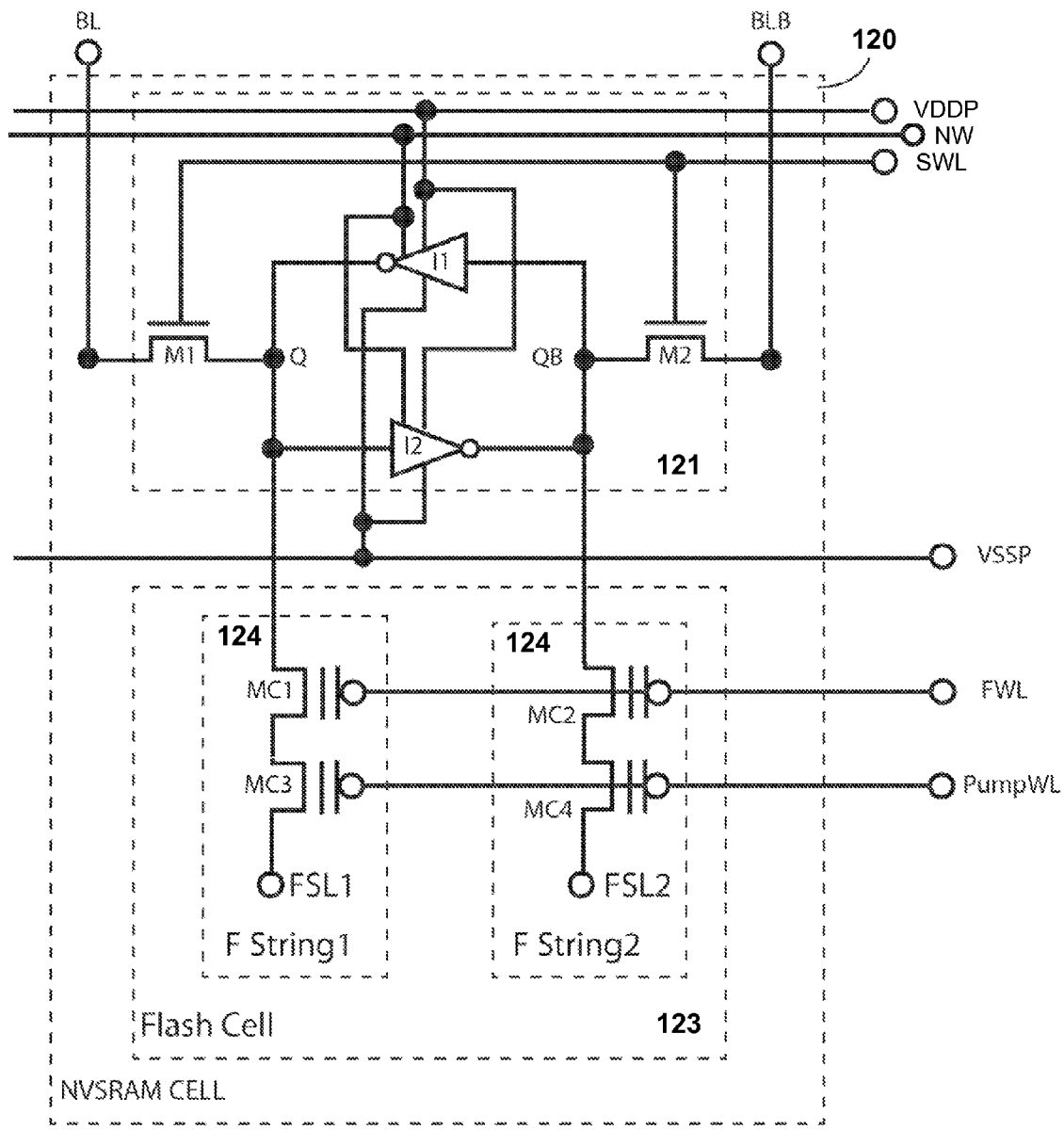
FIG. 1C is a circuit diagram of a 2-poly PMOS 10T NVSRAM cell with one paired flash Charger transistor as a charger according to an embodiment of the present invention.

FIG. 1C shows a third preferred embodiment of a 2-poly PMOS 10T NVSRAM cell with a flash Charger of the present invention. The 10T NVSRAM cell 120 comprises one 6T LV SRAM cell 121 and one 2T PMOS 2-poly Flash cell 123. The SRAM cell 121 is substantially the same as the SRAM cell 101 in terms of two inverters I1 and I2 made by both NMOS and PMOS devices respectively coupled to two power lines VDDP and VSSP, both being electrically separated from a node NW coupled to a common Nwell region of the SRAM cell 121. The source line is coupled to VSSP line. Each 4T PMOS 2-poly Flash cell 123 comprises two fully symmetrical 2T PMOS 2-poly Flash strings 124. Unlike all prior art 12T PMOS NVSRAM cell, each preferred 2T PMOS 2-poly Flash string comprises only one PMOS 2-poly Flash transistor (1T) and one PMOS 2-poly flash transistor acting as a Charger with its source node left floating without the top 2-poly PMOS HV Select transistor and the bottom 2-poly PMOS HV Select transistor. Each paired 2-poly PMOS flash drain nodes are preferably connected to each paired nodes of Q and QB of each 6T CMOS LV SRAM cell directly. Conversely, this 2-poly 10T NVSRAM cell uses a +18V VPP to decrease PMOS Flash transistor Vt during the erase operation and a −18V VNN to increase PMOS Flash transistor Vt during program operation.

The Recall operations of 10T 1-poly NMOS NVSRAM cell with a flash Charger shown in FIG. 1B and 10T PMOS 2-poly NVSRAM cell with a flash Charger shown in FIG. 1C would be similar to the operations for FIG. 1A as explained above. Thus the description is skipped here for brevity.

In FIG. 1B, all operations would be same as FIG. 1A with differences in VPP and VNN voltages. In FIG. 1A a +/−18V for VPP and VNN is used for 10T 2-poly NMOS NVSRAM cell but in FIG. 1B +/−10V for VPP and VNN is used for 10T 1-poly NMOS NVSRAM cell for reducing the number of layers. The FN-channel-erase and Fn-edge program operation for FIG. 1B has less tunneling electric field, thus having a slower erase and program speed. But in principle, the $\Delta Vt12$ generated by ramping the paired Flash-based Charger transistors and ramping FWL to the VDD level to transfer the $\Delta V_{Q-QB}$ at Q and QB nodes of each SRAM is using the same technique and steps. Thus the detailed description is skipped here for brevity. Similarly, for FIG. 1C with a 10T PMOS 2-poly NVSRAM cell with a flash Charger, all operations and steps are the same except the voltage polarity of the FWL voltage has to be ramped from VDD to VSS because the opposite operating condition of the PMOS NVSRAM cell to NMOS NVSRAM cell. The PumpWL voltage is ramped up by using VPP, rather VNN to generate the positive charges in MC3 and MC4 channels.

Similarly, the FN-channel and FN-edge Write schemes can be used for both 1-poly NMOS 10T NVSRAM cell and 2-poly PMOS 10T NVSRAM cells. The VPP and VNN voltages for 2-poly NMOS flash cell and 2-poly PMOS flash cell are substantially the same in values. But in contrast, the 1-poly NMOS charge-trapping SONOS or MONOS flash cell use about +10V VPP and −10V VNN for this preferred Write operation.

Figure 2A:
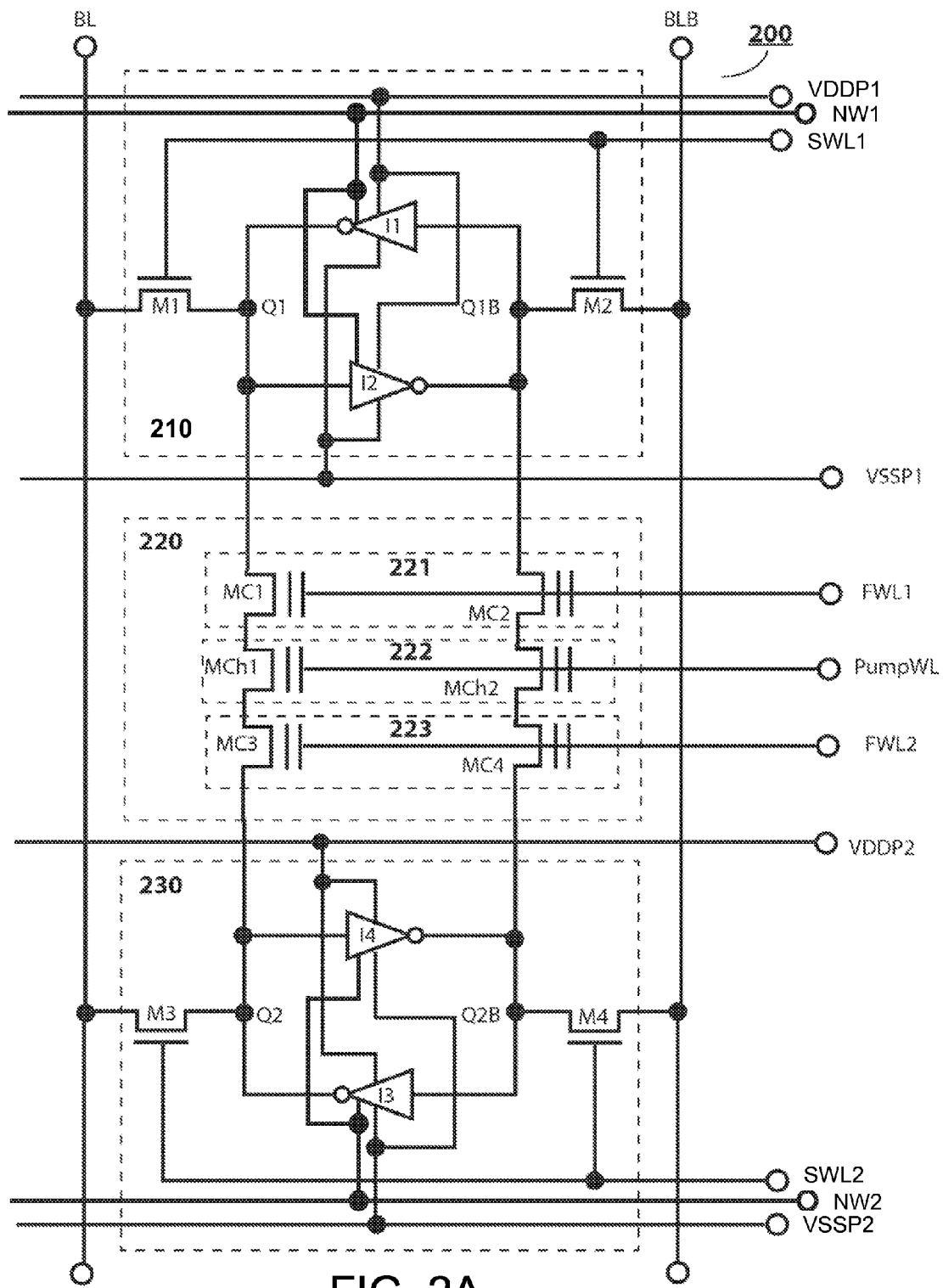
FIG. 2A is a circuit diagram of two 2-poly NMOS Pseudo-8T NVSRAM cell sharing one paired flash transistor as a charger according to an embodiment of the present invention.

FIG. 2A is a circuit diagram of a pair of 2-poly NMOS Pseudo-8T NVSRAM cells of the present invention. Each Pseudo-8T NVSRAM cell 200 comprises two mirrored 6T LV SRAM cells 210 and 230 coupled to one 6T NMOS 2-poly Flash cell 220 as a shared Charger placed in the middle. Each SRAM cell 210 is substantially similar to the SRAM cell 101 and each 6T NMOS 2-poly Flash cell 220 includes two mirrored 2T Flash cells 221 (MC1 and MC2) and 223 (MC3 and MC4) having an additional 2T Flash-based transistors 222 (Mch1 and Mch2) forming the shared Charger. The room for inserting this shared Charger just is taken from the active spacing in two source nodes between two 8T NSVRAM cells. Thus, no extra room is needed for adding this 2-poly Charger transistor. As a result, the layout of this preferred NVSRAM with a shared 2-poly Flash Charger is like an 8T NVSRAM cell with the smallest cell size. It is referred as the Pseudo-8T NVSRAM cell.

This Pseudo-8T NVSRAM cell 200 is the derivative from combining two mirrored 10T NVSRAM cell (100 of FIG. 1A) but sharing one Flash-based Charger 222 in the middle. In other words, only one Charger is required for two adjacent 8T NVSRAM cells in column direction I silicon layout. In addition, this Charger 222 includes one paired same 2-poly NMOS flash transistors of Mch1 and Mch2 with a same type of MC1 and MC2 or MC3 and MC4 can be made right on the source-spacing of two mirrored 10T NVSRAM cells. As a result, the effective cell size becomes like an 8T NMOS 2-poly NVSRAM cell and is referred as a Pseudo-8T NVSRAM cell. Thus this Pseudo-8T 2-poly NVSRAM cell size is further reduced from the cell size of 10T 2-poly NVSRAM cell with a flash Charger in FIG. 1A by around 20%.

Note, the 2-poly Charge NMOS flash transistor can be also made of 1-poly Charge NMOS transistor by shorting poly1 and poly2 layers. The 1-poly Charger NMOS transistor has higher coupling ratio than the 2-poly counterpart. This 2-poly NMOS Pseudo-8T NVSRAM cell uses a +18V VPP to increase NMOS flash transistor Vt during the FN-channel Erase operation and a −18V VNN to decrease NMOS flash transistor Vt during the FN-edge Program operation. The FN-channel Program scheme can also be used but with less ΔVt12 than the counterpart using FN-edge scheme.

As shown in the FIG. 2A, for the Pseudo-8T NVSRAM cell there are no more floating source nodes. The major difference between FIG. 1A and FIG. 2A is that the Pumped HV charges generated by the shared Flash-based Charger (Mch1 and Mch2) would be shared by one top Pseudo-8T NVSRAM cell and one bottom Pseudo-8T NVSRAM cell. As a result, the generated charged may not be enough to sustain the voltage follower circuit for two NVSRAM cells in mirror. But this can be compensated by increasing the 2-fold charges by doubling the channel lengths of Mch1 and Mch2 to keep the same performance in Recall operation as in 10T NVSRAM cell of FIG. 1A with a larger cell size.

Other operations such as FN-channel Erase and FN-edge program for top Pseudo-8T NVSRAM cell and the bottom Pseudo-8T NVSRAM cell should be the same as the description for the 10T NVSRAM cell in FIG. 1A.

For example, the Erase operation can be performed simultaneously on MC1 and MC2 of the top Pseudo-8T NVSRAM cell and the MC3 and MC4 of the bottom Pseudo-8T NVSRAM cell by applying the same VPP voltage to FWL1 in top Pseudo-8T NVSRAM cell and FWL2 to the bottom Pseudo-8T NVSRAM cell on the same time with preset biased conditions of Q1=Q1B=Q2=Q2B=VSS and SWL1=SWL2=VSS to isolate top SRAM cell 210 from top Flash cell 221 and bottom SRAM cell 230 from the bottom Flash cell 223. In today's NVSRAM cell, FWL1 and FWL2 can be shorted together into one FWL line with just one decoder in whole 16 Mb NVSRAM cells that are formed in rows and columns. The PumpWL is don't-care as explained above.

Similarly, to program both MC1 and in top Pseudo-8T NVSRAM cell and the MC3 and MC4 of the bottom Pseudo-8T NVSRAM cell, a same VNN voltage can be applied to FWL1 and FWL2 on the same time with the respective VDD and VSS inputs from top paired nodes of Q1 and Q1B and the bottom paired nodes of Q2 and Q2B set by respective top SRAM cell 210 and bottom SRAM cell 230. Any Flash transistor drain node connected to VDD voltage would get faster FN-edge program than the Flash transistor drain node connected to VSS. After a pre-determined program time, both paired MC1 and MC2 in 221 and MC3 and MC4 in 223 would get programmed to a desired ΔVt12. During the FN-edge program, the voltage of PumpWL can be set to be VSS to isolate top and bottom NVSRAM cells.

In a Recall operation for the pseudo-8T NVSRAM cells with a shared flash charger having a commonly gated PumpWL line, the coupled HV charges generated by ramping one shared PumpWL would be split between MC1 and MC3 in left leg and MC2 and MC4 in right leg.

In a specific implementation of the present invention, a same Vt is assigned for the left leg Flash transistors MC1 and MC3, and another Vt is assigned for right leg Flash transistors MC2 and MC4. Then the lower Vt cell in either left leg or right leg would have half effective HV charges generated from the ramping PumpWL so that $\Delta V_{Q\text{-}QB}$ would be reduced in both Q1 and Q1B nodes in top SRAM cell and Q2 and Q2B in bottom SRAM cell. If the final $\Delta V_{Q\text{-}QB}$ can still be rightly amplified by respective top SRAM cell and bottom SRAM cell, then the channel length of Mch1 and Mch2 do not need to be increased. If not amplified by merely respective top SRAM cell and bottom SRAM cell for more reliable Recall operation, then the channel lengths of both Mch1 and Mch2 can be doubled to maintain the same level of $\Delta V_{Q\text{-}QB}$ at top and bottom Q and QB nodes of top and bottom SRAM cells as the 10T NVSRAM cell with a half flash channel length.

In another specific implementation of the present invention, the logic states of top and bottom Pseudo-8T NVSRAM cells are opposite, then the $\Delta V_{Q\text{-}QB}$ would not be reduced by using the same channel length of Mch1 and Mch2 as in FIG. 1A. The reason is because the coupling-generated HV charges in Mch1 and Mch2 would not be shared by two NVSRAM cells. For example, if MC1 Vt<MC2 Vt but MC3 Vt>MC4 Vt. Then when the PumpWL voltage is ramped to a VPP1 between VDD and VPP, the generated HV charges below Mch1 would leak to Q1 in the top SRAM cell 210 through MC1 and another generated HV charges below Mch2 would leak to Q2B in the bottom SRAM cell 230 through MC4. Therefore, the $\Delta V_{Q\text{-}QB}$ at Q1 and Q1B of the top SRAM cell 210 and the $\Delta V_{Q\text{-}QB}$ at Q2 and Q2B of the bottom SRAM cell 230 would be still equal like $\Delta V_{Q\text{-}QB}$ at Q and QB of the SRAM cell 101 in FIG. 1A with the same channel length of Mch1 and Mch2.

When returning back to normal SRAM operation, the FWL1 and FWL2 should be grounded if the Vts of all MC1, MC2, MC3 and MC4 are positive values. If not, then FWL1 and FWL can be coupled to a negative value of −2V if the lowest Vt is no lower than −2V in MC1, MC2, MC3 and MC4.

In 2-step SRAM amplification stage, the VDDP and VSSP lines of either top and bottom NVSRAM cells can be tied together in this Pseudo-8T NVSRAM cells with a shared flash charger, thus the first ramping up of VDDP (VDDP1 for top SRAM cell and VDDP2 for bottom SRAM cell) and second ramp down of VSSP (VSSP1 for top SRAM cell and VSSP2 for bottom SRAM cell) can be performed as 10T NVSRAM cell with a Flash Charger in the corresponding Recall operation.

In particular, in an example (Case A), a flash Charger transistor Mch1 is configured to generate HV charges that goes only to Q1 of the top SRAM cell of the top pseudo-8T NVSRAM cell when a top pseudo-8T NVSRAM Flash transistor Vt(MC1)<FWL1 and in corresponding bottom pseudo-8T NVSRAM another Flash transistor Vt(MC3)>FWL2. Here in the example, FWL2=FWL1. The charges flow would be blocked by MC3 but passed by MC1.

In another example (Case B), Mch1's generated HV charges go only to Q2 of the bottom SRAM cell of the bottom pseudo-8T NVSRAM cell when the Vt(MC1)>FWL1 and the other Vt(MC3)<FWL2. The charges flow would be blocked by MC1 but passed by MC3.

Further in yet another example (Case C), Mch1 generated HV charges will not go to both Q1 and Q2 on top and bottom pseudo-8T NVSRAM cells when Vt(MC1)<FWL1 and Vt(MC3)<FWL2. The charges flow would be blocked by both MC1 and MC3.

Similarly, the above explanation is valid to Mch2 generated charges distribution between Q1B and Q2B. In still another example (Case D), Mch2 generated HV charges go to Q1B only when Vt(MC2)<FWL1 but Vt(MC4)>FWL2. The charges flow would be blocked by MC4 but passed by MC2.

In one more example (Case E), Mch2 generated HV charges go to Q2B only when Vt(MC2)>FWL1 but Vt(MC4)<FWL2. The charges flow would be blocked by MC2 but passed by MC4.

In a final example (Case F), Mch1 generated HV charges will not go to both Q1B and Q2B, when Vt(MC2)<FWL1 and Vt(MC3)<FWL2. The charges flow would be blocked by both MC1 and MC3. In the present invention, the FWL1=FWL2=FWL=VDD.

Now, the Recall operation of the pseudo-8T 2-poly NMOS NVSRAM cell will be illustrated below with reference to a simulation circuit in FIG. 6A (shown below) where a paired pseudo-8T NVSRAM cell with a shared Flash Charger in the middle but the drain and source nodes of Flash Charger devices, Mch1 and Mch2, are separated in layout. Similarly, the FWL1 and FWL2 are also tied together. The VDDP and VSSP of top and bottom pseudo-10T NVSRAM cells are also tied together in reality.

With above set up conditions, both top and bottom pseudo-8T NVSRAM cells can be programmed and erased simultaneously. In addition, the Store and Recall operations of both NVSRAM cells can be done on the same time too.

In the Recall operation, no SRAM-like current charging scheme is used for charging up with a different voltages of $\Delta V_{Q-QB}$ at nodes, Q and QB, due to the $\Delta Vt$ stored in paired flash transistors, MC1 and MC2, with initial Q=QB=VSS and Vt(MC1)<Vt(MC2), Vt(MC3)>Vt(MC4). Instead, this pseudo-8T NVSRAM cell in accordance with the present invention uses a DRAM-like charge-sensing scheme and a circuit to make $\Delta V_{Q-QB}$>0.2V. As a summary, the bias conditions for the Recall operation of the pseudo-8T NVSRAM cells are listed for six steps as shown in the following Table 5 and supported by the simulation results shown in FIG. 6B.

TABLE 5

| Recall | First step | Second step | Third step | Fourth step | Fifth step | Sixth step |
|---|---|---|---|---|---|---|
| Q1 | VSS | V1 | V1' | V3/VDD | VSS/VDD | VSS/VDD |
| Q1B | VSS | V2 | V2' | VDD/V3 | VDD/VSS | VDD/VSS |
| Q2 | VSS | V1 | V1' | V3/VDD | VSS/VDD | VSS/VDD |
| Q2B | VSS | V2 | V2' | VDD/V3 | VDD/VSS | VDD/VSS |
| BL | VSS | X | X | X | X | Low/High |
| BLB | VSS | X | X | X | X | High/Low |
| SWL1 & SWL2 | VDD pulse | VSS | VSS | VSS | VSS | VDD |
| VDDP | VSS | VSS | VSS | Ramps to VDD | Stays at VDD | VDD |
| PumpWL | VSS | VSS | Ramps to VPP1 | Stays at VPP1 | Stays at VPP1 | VSS |
| VSSP | VSS | Ramps to VDD | VDD | VDD | Ramps to VSS | VSS |
| FWL1 & FWL2 | VSS | Ramps to VDD | Stays at VDD | Stays at VDD | Stays at VDD | VSS |
| Function | SRAM initial set Q = QB = VSS | Detect ΔVt12 coupling | $\Delta V_{Q-QB}$ appears and QB | First SRAM amplification by VDDP | Second SRAM amplification by VSSP | Back to SRAM operation | where 0 V < V1, V2 < V3 < VDD, VDD < VPP1 < VPP.

In an alternative embodiment, the flash word line FWL1 and FWL2 (both are tied together) can be ramped to VSS (if both Vts of two Flash transistors are positive) or to −2V (if one Vt is positive, and one Vt is negative but not lower than −2V) to turn off both Flash transistors after the start of the First SRAM amplification and the second SRAM amplification for achieving better full digital VDD/VSS level with improved isolation between the top SRAM cell amplification and the bottom SRAM cell amplification.

Figure 6A:
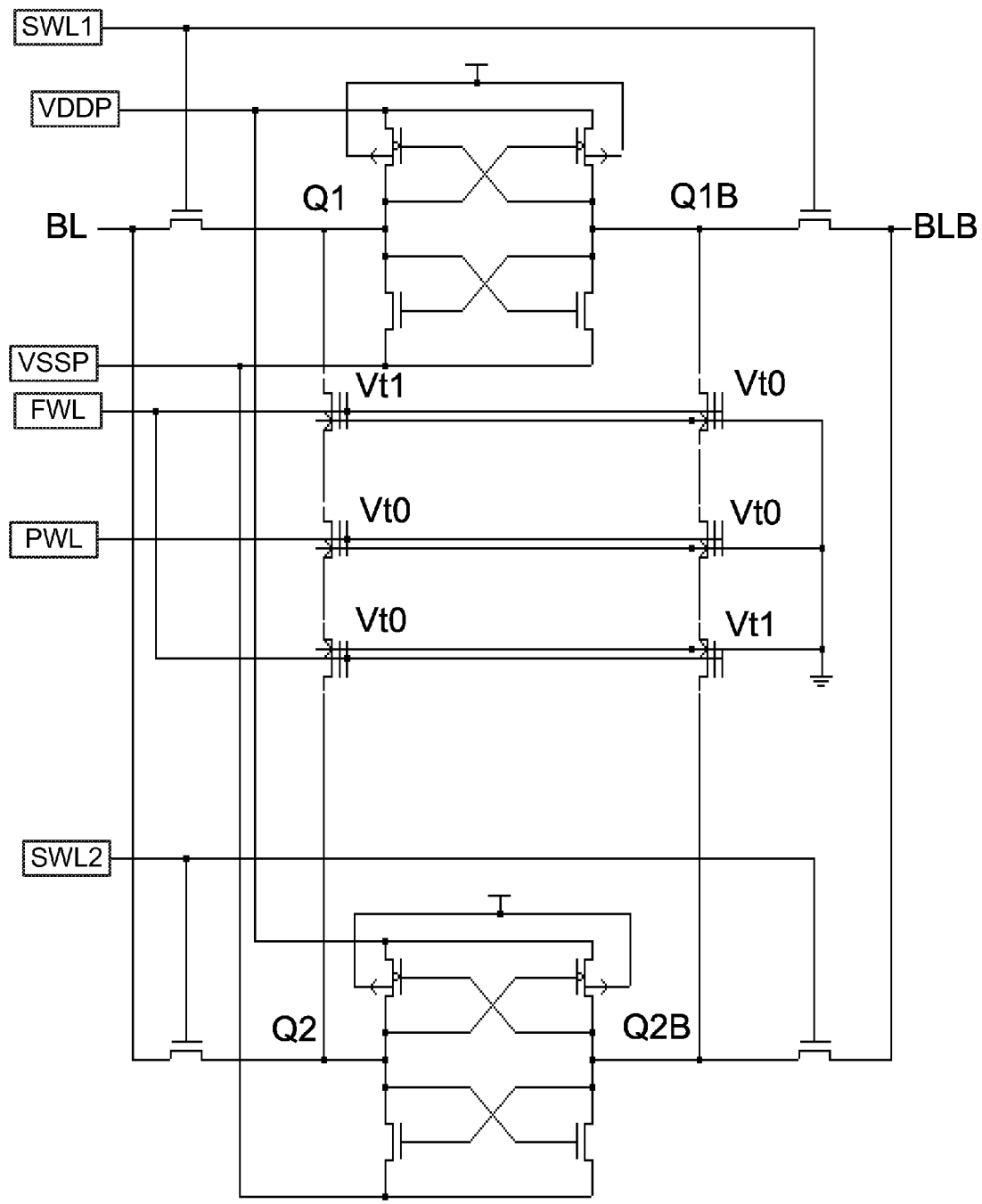
FIG. 6A is a simulation circuit of a Pseudo-8T NMOS 2-poly NVSRAM cell sharing one paired flash transistor as a Charger for performing Recall operation in accordance with the present invention.

FIG. 6A shows the simulation circuit of one pair of Pseudo-8T NVSRAM cells of the present invention. The operations are substantially the same as the ones explained for 10T NVSRAM cell with a flash Charger except that there are a mirrored top and a bottom 8T NVSRAM cells sharing a pair of Charger transistors. As shown, VDDP and VSSP lines are applied to both top SRAM cell and bottom SRAM cell. FWL line is applied to both top Flash cell and bottom Flash cell. The top Flash cell has a first flash transistor with Vt=Vt1 coupled to Q1 node and a second flash transistor with Vt=Vt0 coupled to Q1B node, while conversely the bottom Flash cell has a first flash transistor with Vt=Vt0 coupled to Q2 node and a second flash transistor with Vt=Vt1 coupled to Q2B node.

Figure 6B:
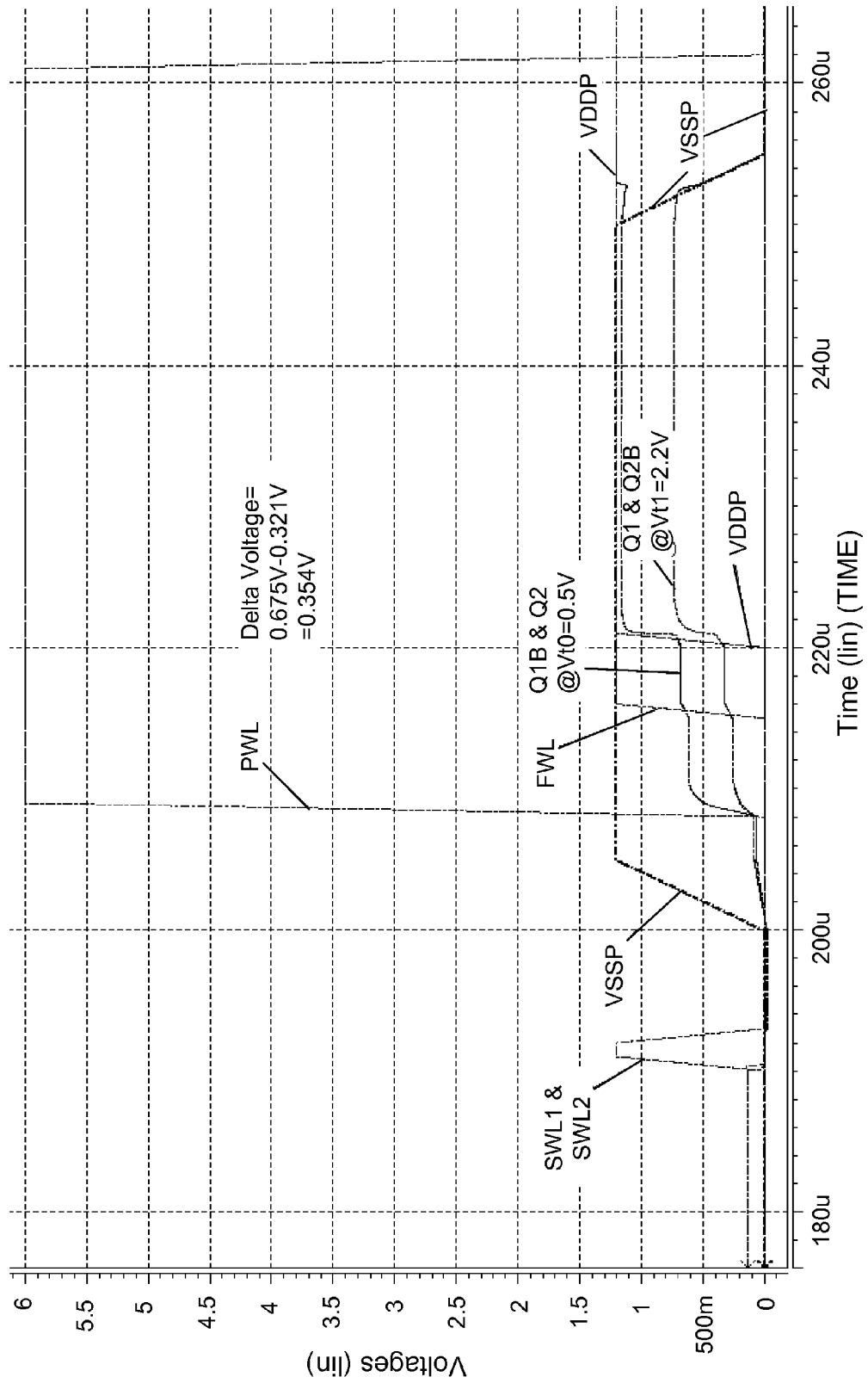
FIG. 6B is a chart showing simulation result based on the simulation circuit of FIG. 6A at one selected threshold level setting in accordance with the present invention.

FIG. 6B shows the opposite stored logic states of the top and bottom Flash transistors in top and bottom 8T NVSRAM cells, thus the coupling-generated voltages on the respective nodes coincide with each other. For example, the Vt of Flash transistors respectively coupled to Q1 and Q2B is Vt1=2.2V but the Vt of Flash transistors respectively coupled to Q1B and Q2 is Vt0=0.5V as the simulation shown in FIG. 5B. The simulations of FIG. 5B and FIG. 6B are almost the same because one Flash being conduction state but one in non-conduction state. The charge-sharing in respective Q and QB nodes are identical from circuit viewpoint. Thus the explanation is skipped here.

Nevertheless, the simulations of FIG. 6B prove that the NVSRAM Recall operation based on the Pseudo-8T NVSRAM cell works for the same and opposite polarity of stored logic states. As a result, the present invention of the Pseudo- 8T NVSRAM cell is proven able to further reduce the NVSRAM cell size from 10T NVSRAM cell by 20% with the same performance.

Figure 2B:
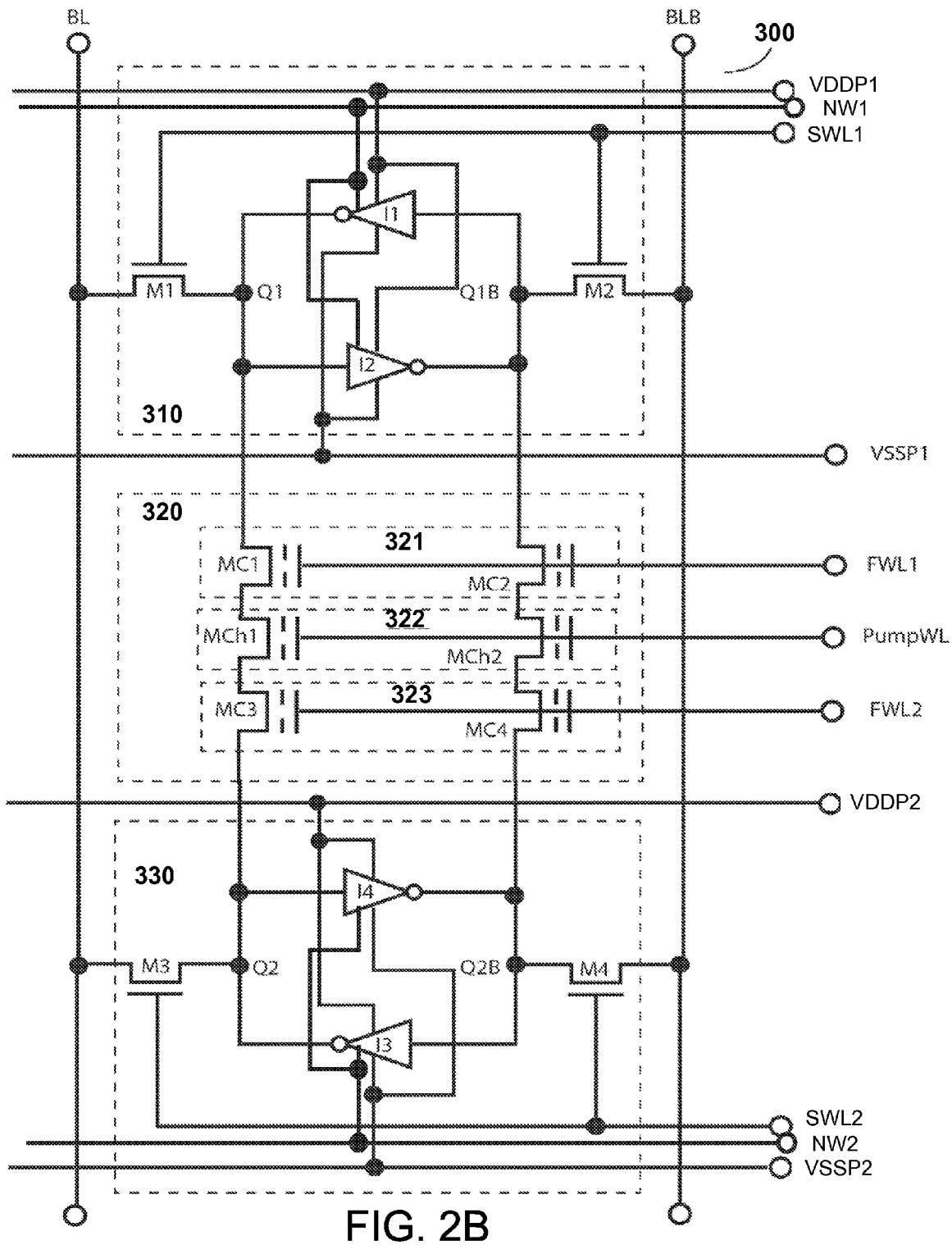
FIG. 2B is a circuit diagram of two 1-poly NMOS Pseudo-8T NVSRAM cell sharing one paired flash transistor as a charger according to an embodiment of the present invention.

FIG. 2B is a circuit diagram of a pair of 1-poly, NMOS, Pseudo-8T NVSRAM cell of the present invention. Similarly to FIG. 2A, each 1-poly, NMOS, Pseudo-8T NVSRAM cell comprises one 6T LV SRAM cell 310 or 330 and one 2T NMOS 1-poly Flash cell 322 or 323 with a shared flash Charger 322 between two adjacent-8T NMOS NVSRAM cells 310 and 330 without taking extra room in silicon layout.

This 1-poly Pseudo-8T NVSRAM cell preferably uses a 1-poly NMOS flash transistor with an assigned Vt. The VPP is used for the FN-channel erase operation but VNN voltage is used for the FN-edge program operation like the Pseudo-8T 2-poly NMOS NVSRAM cell in FIG. 2A.

This 1-poly NMOS Pseudo-8T NVSRAM cell uses a +10V VPP for FN-channel erase operation which is lower than the VPP of +18V used in 2-poly NMOS NVSRAM cell counterpart and uses a −10V VNN for FN-edge program operation which is less than the −18V used in Pseudo-8T 2-poly NMOS NVSRAM cell in FIG. 2A and 10T 2-poly NMOS NVSRAM cell in FIG. 1A. All NVSRAM operations of the Pseudo-8T 1-poly NVSRAM cell are substantially the same as those described for the Pseudo-8T 2-poly NMOS NVSRAM cell in FIG. 2A or 10T 2-poly NMOS NVSRAM cell in FIG. 1A, the descriptions are skipped here without losing the spirit of the present invention.

Figure 2C:
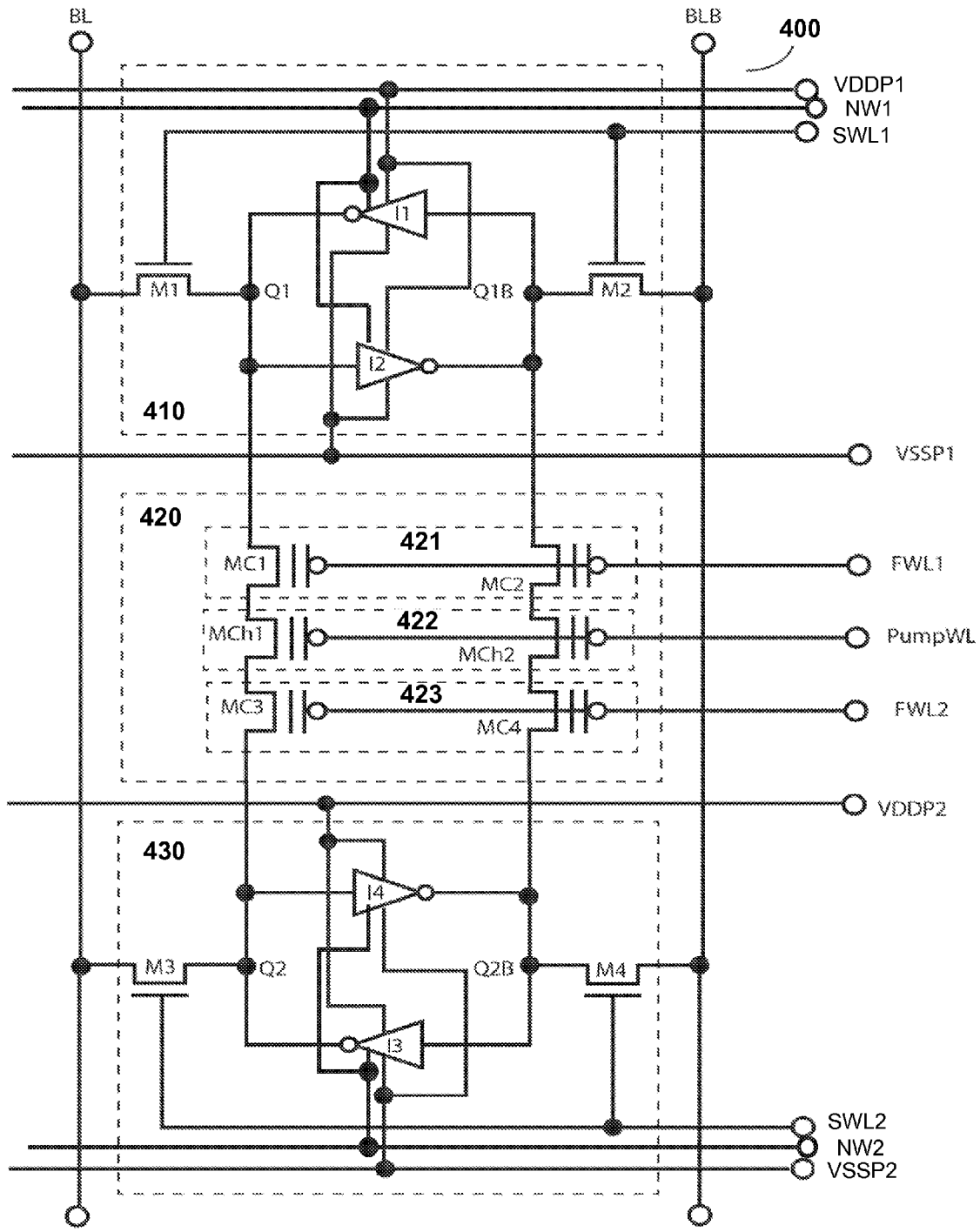
FIG. 2C is a circuit diagram of two 2-poly PMOS Pseudo-8T NVSRAM cell sharing one paired flash transistor as a charger according to an embodiment of the present invention.

FIG. 2C is a circuit diagram of a pair of 2-poly PMOS Pseudo 8T NVSRAM cell of the present invention. Each 2-poly, PMOS, Pseudo-8T NVSRAM cell comprises one 6T LV SRAM cell 410 or 430 and one 2T PMOS 2-poly Flash cell 421 or 423. All NVSRAM operations of the Pseudo-8T 2-poly PMOS NVSRAM cell are substantially the same as those described for the Pseudo-8T 2-poly NMOS NVSRAM cell in FIG. 2A or 10T 2-poly NMOS NVSRAM cell in FIG. 1A, the descriptions are skipped here without losing the spirit of the present invention.

Although the above has been illustrated according to specific embodiments, there can be other modifications, alternatives, and variations. It is understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A 10T NVSRAM memory cell circuit with a pair of flash-based transistors as a charger, the 10T NVSRAM memory cell comprising:

a SRAM cell comprising two inverters cross-coupled to a first pass transistor and a second pass transistor commonly gated by a first word line and respectively coupled drains to a first bit line and a second bit line and sources to a first data node and a second data node, the first data node and the second data node respectively being outputted from the two inverters, each inverter including a PMOS device connected to a first power line and a NMOS device connected to a second power line, the first power line and the second power line being operated between a VDD power supply and ground and being separated from a common Nwell node; and a Flash cell comprising a first cell string and a second cell string sharing a common P-sub, the first/second cell string including a first/second Flash transistor and a first/second Charger transistor connected in series, the first Flash transistor having a first drain node coupled to the first data node, the second Flash transistor having a second drain node coupled to the second data node, the first Charger transistor having a first source node left floating, the second Charger transistor having a second source node left floating, the first Flash transistor and the second Flash transistor being commonly gated by a second word line, the first Charger transistor and the second Charger transistor being commonly gated by a pump word line;

wherein the first Charger transistor and the second Charger transistor are configured to ramp the pump word line up to a high voltage above the VDD level to generate charges and respectively pass through the first Flash transistor with a first threshold level and the second Flash transistor with a second threshold level to create a voltage level difference at the first data node and the second data node by subsequently ramping the second word line to the VDD level, the two cross-coupled inverters are operated to amplify the voltage level difference to a scale of VSS=0V at one of the first data node and the second data node and the VDD level at another one of the first data node and the second data node.

2. The 10T NVSRAM memory cell of claim 1 wherein each of the first Flash transistor and the second Flash transistor is selected from a 2-poly NMOS floating-gate type transistor, a 1-poly SONOS or MONOS charge-trapping type transistor, and a 2-poly PMOS floating-gate type transistor.

3. The 10T NVSRAM memory cell of claim 1 wherein each of the first Charger transistor and the second Charger transistor is a same type as each of the first Flash transistor and the second Flash transistor no matter that is selected from a 2-poly NMOS floating-gate type transistor, a 1-poly SONOS or MONOS charge-trapping type transistor, and a 2-poly PMOS floating-gate type transistor.

4. The 10T NVSRAM memory cell of claim 1 wherein the SRAM cell is subjected to a Read and Write operation by setting the first word line to the VDD level if the SRAM cell is selected or to VSS=0V if the SRAM cell is not selected and applying the VDD level to the first power line, VSS to the second power line and the pump word line, while setting the second word line to VSS=0V if the threshold levels of the first Flash transistor and the second Flash transistor are all positive or setting the second word line to a lowest negative threshold level if the threshold levels of the first Flash transistor and the second Flash transistor are all negative, to isolated each SRAM cell from each corresponding Flash cell.

5. The 10T NVSRAM memory cell of claim 1 wherein the Flash cell is subjected to an Erase operation including a preset step by setting both the first data node and the second data node to VSS under a condition of setting the first word line to the VDD level, the first power line to VSS, the second power line to VSS, the first bit line and the second bit line to VSS, followed by an erase step by applying a positive high voltage VPP to the second word line to increase threshold levels of both the first Flash transistor and the second Flash transistor to a level above the VDD level under a FN-channel scheme in less than 5 ms, along with a Don't care state for the pump word line.

6. The 10T NVSRAM memory cell of claim 4 wherein the positive voltage VPP is about +18V for a 2-poly floating-gate type flash transistor or about +10V for a 1-poly charge-trapping type flash transistor, and the VDD level is about 1V to 2V.

7. The 10T NVSRAM memory cell of claim 1 wherein the Flash cell is subjected to a Program operation for defining a flash logic state, the Program operation including a preset step of setting the first word line to VSS, applying the VDD level to the first power line and VSS=0V to the second power line, and loading a logic state "1" of the SRAM cell with the first data node at the VDD level and the second data node at VSS=0V, the Program operation further including a programming step of ramping the second word line from VSS to a negative high voltage VNN using a FN-edge scheme to decrease the first threshold level of the first Flash transistor to a first final level and to decrease the second threshold level of the second Flash transistor to a second final level along with a Don't care state for the pump word line, the first final level being lower than the second final level by at least 1V, thereby storing the flash logic state "0" in the Flash cell.

8. The 10T NVSRAM memory cell of claim 1 wherein the Flash cell is subjected to a Program operation for defining a flash logic state, the Program operation including a preset step of setting the first word line to VSS, applying the VDD level to the first power line and VSS=0V to the second power line, and loading a logic state "0" of the SRAM cell with the first data node at VSS=0V and the second data node at the VDD level, the Program operation including a programming step of ramping the second word line from VSS to a negative high voltage VNN using a FN-edge scheme to decrease the first threshold level of the first Flash transistor to a first final level and to decrease the second threshold level of the second Flash transistor to a second final level along with a Don't care state for the pump word line, the first final level being higher than the second final level by at least 1V, thereby storing the flash logic state "1" in the Flash cell.

9. The 10T NVSRAM memory cell of claim 8 wherein the negative voltage VNN is ranging from −15V to −18V for a 2-poly floating-gate type flash transistor or about −10V for a 1-poly charge-trapping type flash transistor.

10. The 10T NVSRAM memory cell of claim 1 wherein the Flash cell is subjected to a Store operation comprises using a FN-channel erase operation followed by a FN-edge program operation to write a loaded logic state from the SRAM cell to the Flash cell.

11. The 10T NVSRAM memory cell of claim 10 wherein the FN-channel erase operation comprises using +15V or greater positive voltage at the second word line along with VSS at the pump word line to increase threshold levels of the first Flash transistor and the second Flash transistor to a same level substantially above the VDD level.

12. The 10T NVSRAM memory cell of claim 11 wherein the FN-edge program operation comprises using −15V or greater negative voltage at the second word line along with VSS at the pump word line to decrease threshold level of one of the first Flash transistor and the second Flash transistor to a level below the VDD level while keep another threshold level of another one of the first Flash transistor and the second Flash transistor to a level remained above the VDD level.

13. The 10T NVSRAM memory cell of claim 1 wherein the SRAM cell is subjected to a Recall operation for writing a flash logic state stored in the Flash cell back to the first data node and the second data node under a charge-sensing scheme assisted by the first Charger transistor and the second Charger transistor, the flash logic state including at least a state "1" defined by assigning the first threshold level at Vt1 for the first Flash transistor and the second threshold level at Vt0<Vt1 for the second Flash transistor or a state "0" defined by assigning the first threshold level at Vt0 for the first Flash transistor and the second threshold level at Vt1>Vt0 for the second Flash transistor.

14. The 10T NVSRAM memory cell of claim 13 wherein the Vt0 is preferred to be a negative value about −2V and the Vt1 is preferred to be a positive value above the VDD level.

15. The 10T NVSRAM memory cell of claim 13 wherein the Recall operation for writing the flash logic state "0" to the SRAM cell comprises initializing the SRAM cell with the first data node and the second data node, the first bit line and the second bit line, the first power line and the second power line all at VSS=0V by pulsing the first word line to the VDD level, and setting the second word line and the pump word line to VSS, followed by firstly ramping the second power line from VSS to the VDD level, secondly ramping the pump word line from VSS to a level substantially above the VDD level, and thirdly ramping the second word line from VSS to the VDD level, and sequentially ramping the first power line from VSS to the VDD level while maintaining the second power line at the VDD level in a first amplification step followed by ramping the second power line from the VDD level to VSS while maintaining the first power line at the VDD level in a second amplification step.

16. The 10T NVSRAM memory cell of claim 15 wherein firstly ramping the second power line from VSS to the VDD level comprises forming a reversed bias condition for the two Inverters of the SRAM cell to prevent charges in the first data node and the second data node from leaking.

17. The 10T NVSRAM memory cell of claim 15 wherein secondly ramping the pump word line from VSS to the level substantially above the VDD level comprises keeping voltage level of the pump word line below a programming voltage VPP of +18V for generating coupling charges in drain nodes of the first Charger transistor and the second Charger transistor, the coupling charges being coupled through the first Flash transistor to the first data node with a first level of charges and coupled through the second Flash transistor to the second data node with a second level of charges, the first level being higher than the second level due to Vt0<Vt1.

18. The 10T NVSRAM memory cell of claim 17 wherein thirdly ramping the second word line from VSS to the VDD level comprises using a charge voltage-follower operation through the first Flash transistor to push the first level of charges at the first data node to a third level of charges and through the second Flash transistor to push the second level of charges at the second data node to a fourth level of charges, the third level being higher than the fourth level due to Vt0<Vt1.

19. The 10T NVSRAM memory cell of claim 18 wherein ramping the first power line from VSS to the VDD level while maintaining the second power line at the VDD level in a first amplification step comprises pulling up the third level of charges at the first data node to substantially the VDD level and pulling up the fourth level of charges at the second data node to a fifth level of charges, the fifth level being lower than the VDD level.

20. The 10T NVSRAM memory cell of claim 19 wherein ramping the second power line from the VDD level to VSS while maintaining the first power line at the VDD level in a second amplification step comprises pulling down the fifth level of charges at the second data node to VSS=0V while maintaining the VDD level at the first data node.

21. The 10T NVSRAM memory cell of claim 19 wherein ramping the first power line from VSS to the VDD level while maintaining the second power line at the VDD level in a first amplification step comprises coupling the second word line to a negative bias voltage below a lowest threshold level to turn off both the first Flash transistor and the second Flash transistor.

22. The 10T NVSRAM memory cell of claim 20 wherein ramping the second power line from the VDD level to VSS while maintaining the first power line at the VDD level in a second amplification step comprises coupling the second word line to a negative bias voltage below a lowest threshold level to turn off both the first Flash transistor and the second Flash transistor.

23. The 10T NVSRAM memory cell of claim 15 wherein the Recall operation further comprises setting the first word line to the VDD level and resetting the first power line to the VDD level, the second power line to VSS, and the second word line to VSS to return to a SRAM operation with a loaded SRAM logic state "1" associated with the VDD level at the first data node and VSS at the second data node.

24. A paired pseudo-8T NVSRAM memory cell circuit with a shared flash charger, the paired pseudo-8T NVSRAM memory cell comprising:
a first pseudo-8T NVSRAM cell having a first flash source terminal and second flash source terminal;
a second pseudo-8T NVSRAM cell having a third flash source terminal and fourth flash source terminal; and
a first Charger transistor and a second Charger transistor commonly gated by a pump word line, the first Charger transistor having a first charger drain node connected to the first flash source terminal and a first charger source node connected to the third flash source terminal, the second Charger transistor having a second charger drain node connected to the second flash source terminal and a second charger source node connected to the fourth flash source terminal;
wherein the first pseudo-8T NVSRAM cell and the second pseudo-8T NVSRAM cell are configured to be substantially same in a NVSRAM cell structure sharing separately a first common power line and a second common power line respectively operated between a VDD power supply and ground, the NVSRAM cell structure comprising,
a SRAM cell comprising two inverters cross-coupled to a first pass transistor and a second pass transistor commonly gated by a first word line and respectively coupled drains to a first bit line and a second bit line and sources to a first data node and a second data node, the first data node and the second data node respectively being outputted from the two inverters, each inverter including a PMOS device connected to the first power line and a NMOS device connected to the second power line, the first power line and the second power line being separated from a common Nwell node; and
a Flash cell comprising a first cell string and a second cell string sharing a common P-sub, the first/second cell string including a first/second Flash transistor, the first Flash transistor having a first drain node and a first source node, the first drain node being coupled to the first data node, the second Flash transistor having a second drain node and a second source node, the second drain node being coupled to the second data node, the first Flash transistor and the second Flash transistor being commonly gated by a second word line;
wherein the first/second source node of the first pseudo-8T NVSRAM cell is the first/second flash source terminal and the first/second source node of the second pseudo-8T NVSRAM cell is the third/fourth flash source terminal;
wherein the first Charger transistor and the second Charger transistor are configured to ramp the pump word line up to a high voltage above the VDD level to generate charges and use a charge-sensing scheme and voltage-follower operation for performing a Recall operation to write a Flash logic state represented by threshold levels of the first Flash transistor and the second Flash transistor in either the first pseudo-8T NVSRAM cell or the second pseudo-8T NVSRAM cell to corresponding SRAM logic state stored by voltage levels of the first data node and the second data node in corresponding the first pseudo-8T NVSRAM cell or the second pseudo-8T NVSRAM cell.

25. The paired pseudo-8T NVSRAM memory cell of claim 24 wherein each of the first Flash transistor and the second Flash transistor in either the first pseudo-8T NVSRAM cell or the second pseudo-8T NVSRAM cell is selected from a 2-poly NMOS floating-gate type transistor, a 1-poly SONOS or MONOS charge-trapping type transistor, and a 2-poly PMOS floating-gate type transistor.

26. The paired pseudo-8T NVSRAM memory cell of claim 24 wherein each of the first Charger transistor and the second Charger transistor is a same type as each of the first Flash transistor and the second Flash transistor no matter that is selected from a 2-poly NMOS floating-gate type transistor, a 1-poly SONOS or MONOS charge-trapping type transistor, and a 2-poly PMOS floating-gate type transistor.

27. The paired pseudo-8T NVSRAM memory cell of claim 24 wherein the SRAM cell in either the first pseudo-8T NVSRAM cell or the second pseudo-8T NVSRAM cell is subjected to a Read and Write operation by setting the first word line to the VDD level if the SRAM cell is selected or to VSS=0V if the SRAM cell is not selected and applying the VDD level to the first power line, VSS to the second power line and the pump word line, while setting the second word line to VSS=0V if the threshold levels of the first Flash transistor and the second Flash transistor are all positive or at least below a lowest negative threshold level if one threshold level of the first Flash transistor and the second Flash transistor is a negative value, to isolated each SRAM cell from each corresponding Flash cell.

28. The paired pseudo-8T NVSRAM memory cell of claim 24 wherein the Flash cell in either the first pseudo-8T NVSRAM cell or the second pseudo-8T NVSRAM cell is subjected to an Erase operation including a preset step by setting both the first data node and the second data node to VSS under a condition of setting the first word line to the VDD level, the first power line to VSS, the second power line to VSS, the first bit line and the second bit line to VSS, followed by an erase step by applying a positive high voltage VPP to the second word line to increase threshold levels of both the first Flash transistor and the second Flash transistor to a level above the VDD level under a FN-channel scheme in less than 5 ms, along with a Don't care state for the pump word line.

29. The paired pseudo-8T NVSRAM memory cell of claim 28 wherein the positive voltage VPP is about +18V for a 2-poly floating-gate type flash transistor or about +10V for a 1-poly charge-trapping type flash transistor, and the VDD level is about 1V to 2V.

30. The paired pseudo-8T NVSRAM memory cell of claim 24 wherein the Flash cell in either the first pseudo-8T NVSRAM cell or the second pseudo-8T NVSRAM cell is subjected to a Program operation for defining a flash logic state, the Program operation including a preset step of setting the first word line to VSS, applying the VDD level to the first power line and VSS=0V to the second power line, and loading a logic state "1" of the SRAM cell with the first data node at the VDD level and the second data node at VSS=0V, the Program operation including a programming step of ramping the second word line from VSS to a negative high voltage VNN using a FN-edge scheme to decrease threshold level of the first Flash transistor to a first final level and to decrease threshold level of the second Flash transistor to a second final level along with a Don't care state for the pump word line, the first final level being lower than the second final level by at least 1V, thereby storing the flash logic state "0" in the Flash cell.

31. The paired pseudo-8T NVSRAM memory cell of claim 24 wherein the Flash cell in either the first pseudo-8T NVSRAM cell or the second pseudo-8T NVSRAM cell is subjected to a Program operation for defining a flash logic state, the Program operation including a preset step of setting the first word line to VSS, applying the VDD level to the first power line and VSS=0V to the second power line, and loading a logic state "0" of the SRAM cell with the first data node at VSS=0V and the second data node at the VDD level, the Program operation including a programming step of ramping the second word line from VSS to a negative high voltage VNN using a FN-edge scheme to decrease threshold level of the first Flash transistor to a first final level and to decrease threshold level of the second Flash transistor to a second final level along with a Don't care state for the pump word line, the first final level being higher than the second final level by at least 1V, thereby storing the flash logic state "1" in the Flash cell.

32. The paired pseudo-8T NVSRAM memory cell of claim 31 wherein the negative voltage VNN is ranging from −15V to −18V for a 2-poly floating-gate type flash transistor or about −10V for a 1-poly charge-trapping type flash transistor.

33. The paired pseudo-8T NVSRAM memory cell of claim 24 wherein each SRAM cell in both the first pseudo-8T NVSRAM cell and the second pseudo-8T NVSRAM cell is simultaneously subjected to a Recall operation for writing a flash logic state stored in corresponding Flash cell back to the first data node and the second data node under a charge-sensing scheme assisted by the first Charger transistor and the second Charger transistor, the flash logic state including at least a state "1" defined by assigning the first threshold level at Vt1 for the first Flash transistor and the second threshold level at Vt0<Vt1 for the second Flash transistor or a state "0" defined by assigning the first threshold level at Vt0 for the first Flash transistor and the second threshold level at Vt1>Vt0 for the second Flash transistor.

34. The paired pseudo-8T NVSRAM memory cell of claim 33 wherein the Recall operation for writing the flash logic state "0" to the SRAM cell comprises initializing the SRAM cell with the first data node and the second data node, the first bit line and the second bit line, the first power line and the second power line all at VSS=0V by pulsing the first word line to the VDD level, and setting the second word line and pump word line to VSS, followed by firstly ramping the second power line from VSS to the VDD level, secondly ramping the pump word line from VSS to a level substantially above the VDD level, and thirdly ramping the second word line from VSS to the VDD level, followed by sequentially ramping the first power line from VSS to the VDD level while maintaining the second power line at the VDD level and ramping the second power line from the VDD level to VSS while maintaining the first power line at the VDD level.

35. The paired pseudo-8T NVSRAM memory cell of claim 34 wherein ramping the second power line from VSS to the VDD level comprises forming a reversed bias condition for the two Inverters of the SRAM cell to prevent charges in the first data node and the second data node from leaking.

36. The paired pseudo-8T NVSRAM memory cell of claim 34 wherein ramping the pump word line from VSS to the level substantially above the VDD level comprises keeping voltage level of the pump word line below a programming voltage VPP of +18V for generating coupling charges in drain nodes of the first Charger transistor and the second Charger transistor, the coupling charges being coupled through the first Flash transistor to the first data node with a first level of charges and coupled through the second Flash transistor to the second data node with a second level of charges, the first level being higher than the second level due to Vt0<Vt1.

37. The paired pseudo-8T NVSRAM memory cell of claim 36 wherein ramping the second word line from VSS to the VDD level comprises using a charge voltage-follower operation through the first Flash transistor to push the first level of charges at the first data node to a third level of charges and through the second Flash transistor to push the second level of charges at the second data node to a fourth level of charges, the third level being higher than the fourth level due to Vt0<Vt1.

38. The paired pseudo-8T NVSRAM memory cell of claim 37 wherein ramping the first power line from VSS to the VDD level while maintaining the second power line at the VDD level comprises pulling up the third level of charges at the first data node to substantially the VDD level in a first SRAM amplification operation and pulling up the fourth level of charges at the second data node to a fifth level of charges, the fifth level being lower than the VDD level.

39. The paired pseudo-8T NVSRAM memory cell of claim 38 wherein ramping the second power line from the VDD level to VSS while maintaining the first power line at the VDD level comprises pulling down the fifth level of charges at the second data node to VSS=0V in a second SRAM amplification operation while maintaining the VDD level at the first data node.

40. The paired pseudo-8T NVSRAM memory cell of claim 38 wherein ramping the first power line from VSS to the VDD level while maintaining the second power line at the VDD level comprises coupling the second word line to a negative bias voltage to turn off both the first Flash transistor and the second Flash transistor to ensure the first SRAM amplification operation in the first pseudo-8T NVSRAM cell free from any cross-talk with the first SRAM amplification in the second pseudo-8T NVSRAM cell.

41. The paired pseudo-8T NVSRAM memory cell of claim 39 wherein ramping the second power line from the VDD level to VSS while maintaining the first power line at the VDD level comprises coupling the second word line to a negative bias voltage to turn off both the first Flash transistor and the second Flash transistor to ensure the second SRAM amplification operation in the first pseudo-8T NVSRAM cell free from any cross-talk with the second SRAM amplification in the second pseudo-8T NVSRAM cell.

42. The paired pseudo-8T NVSRAM memory cell of claim 34 wherein the Recall operation further comprises setting the first word line to the VDD level and resetting the first power line to the VDD level, the second power line to VSS, and the second word line to VSS if the Vt0 is a positive value or to at least below a lowest negative threshold level if the Vt0 is a negative value to return to a SRAM operation with a loaded SRAM logic state "1" associated with the VDD level at the first data node and VSS at the second data node in the corresponding SRAM cell.

43. The paired pseudo-8T NVSRAM memory cell of claim 33 wherein the Vt0 is preferred to be a negative value about −2V and the Vt1 is preferred to be a positive value above the VDD level.

44. The paired pseudo-8T NVSRAM memory cell of claim 24 wherein the first Charger transistor and the second Charger transistor are configured to optionally have their channel lengths doubled for generating doubled charges shared with the first pseudo-8T NVSRAM cell and the second pseudo-8T NVSRAM cell enough for performing the Recall operation under the charge-sensing scheme when the Flash logic state represented by threshold levels of the first Flash transistor and the second Flash transistor in the first pseudo-8T NVSRAM cell is same as the Flash logic state represented by threshold levels of the first Flash transistor and the second Flash transistor in the second pseudo-8T NVSRAM cell.

45. The paired pseudo-8T NVSRAM memory cell of claim 24 wherein the first Charger transistor and the second Charger transistor are configured to have their original channel lengths for generating the charges separately for the first pseudo-8T NVSRAM cell and the second pseudo-8T NVSRAM cell enough for performing the Recall operation under the charge-sensing scheme when the Flash logic state represented by threshold levels of the first Flash transistor and the second Flash transistor in the first pseudo-8T NVSRAM cell is opposite to the Flash logic state represented by threshold levels of the first Flash transistor and the second Flash transistor in the second pseudo-8T NVSRAM cell.

* * * * *